United States Patent
Ohta et al.

(10) Patent No.: US 6,379,998 B1
(45) Date of Patent: Apr. 30, 2002

(54) SEMICONDUCTOR DEVICE AND METHOD FOR FABRICATING THE SAME

(75) Inventors: Hiroyuki Ohta, Ibaraki-ken; Hideo Miura, Tsuchiura; Mitsuo Usami, Akishima; Masatsugu Kametani, Tsuchiura; Munetoshi Zen, Ryugasaki; Noriaki Okamoto, Ibaraki-ken, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/007,061

(22) Filed: Jan. 21, 1993

Related U.S. Application Data

(63) Continuation-in-part of application No. 07/636,562, filed on Jan. 7, 1991, now Pat. No. 5,297,260, which is a continuation of application No. 07/471,801, filed on Dec. 15, 1989, now abandoned, which is a continuation of application No. 07/013,548, filed on Feb. 11, 1987, now abandoned.

(30) Foreign Application Priority Data

| Mar. 12, 1986 | (JP) | 61-052448 |
| Oct. 20, 1986 | (JP) | 61-247436 |
| Jan. 21, 1992 | (JP) | 4-008190 |
| Mar. 19, 1992 | (JP) | 4-063217 |

(51) Int. Cl.[7] .......... H01L 21/44; H01L 21/48; H01L 21/50; H01L 21/301

(52) U.S. Cl. .......... 438/107; 438/113; 438/118; 438/690; 438/463; 438/598

(58) Field of Search .......... 437/205, 206, 437/249, 294, 228 SE; 156/647.1, 657, 662, 306.3; 148/DIG. 28, DIG. 12; 438/107, 113, 118, 690, FOR 100, FOR 119, FOR 134, FOR 365, FOR 386, FOR 340, 463, 598

(56) References Cited

U.S. PATENT DOCUMENTS

| 3,765,969 A | * 10/1973 | Kragness et al. ............. 156/17 |
| 3,932,841 A | 1/1976 | Deerfield et al. ........... 395/325 |
| 4,058,711 A | 11/1977 | Onderctu et al. ....... 395/800 X |
| 4,151,592 A | 4/1979 | Suzuki et al. ................ 395/325 |
| 4,153,942 A | 5/1979 | Gregory ..................... 364/900 |
| 4,164,787 A | 8/1979 | Aranguren .................. 364/200 |
| 4,172,283 A | 10/1979 | Kober ........................ 364/200 |
| 4,204,251 A | 5/1980 | Brudevold .................. 364/200 |
| 4,214,305 A | 7/1980 | Tokita et al. ................ 364/200 |
| 4,215,395 A | 7/1980 | Bungard et al. ............ 364/134 |
| 4,237,534 A | 12/1980 | Felix .......................... 364/200 |
| 4,257,095 A | 3/1981 | Nadir ......................... 364/200 |
| 4,270,167 A | 5/1981 | Koehler et al. ............. 395/325 |
| 4,413,020 A | * 11/1983 | McKee et al. |
| 4,422,142 A | 12/1983 | Ihaba et al. ................. 364/200 |
| 4,443,846 A | 4/1984 | Adcock ...................... 364/200 |
| 4,470,109 A | 9/1984 | McNally .................... 364/200 |

(List continued on next page.)

FOREIGN PATENT DOCUMENTS

| EP | 0123509 | 4/1984 | |
| 4,698,753 A | 10/1987 | Hubbins et al. ........... 364/200 |
| 4,720,470 A | * 1/1988 | Johnson |

(List continued on next page.)

OTHER PUBLICATIONS

"Silicon Hybrid Wafer–Scale Package Technology", R.W. Johnson et al. IEEE Journal of Solid–State Circuit, vol. SC–21, No. 5, Oct. 1986.*

(List continued on next page.)

*Primary Examiner*—David E. Graybill
(74) *Attorney, Agent, or Firm*—Antonelli, Terry, Stout & Kraus, LLP

(57) ABSTRACT

A process of contacting sides of a plurality of chips having semiconductor elements formed in a substrate surface, directly to each other on the same {111} crystal plane.

6 Claims, 27 Drawing Sheets

U.S. PATENT DOCUMENTS

| | | | | |
|---|---|---|---|---|
| 4,495,567 A | | 1/1985 | Treen .......................... 364/200 |
| 4,495,569 A | | 1/1985 | Kagawa ...................... 364/200 |
| 4,542,397 A | * | 9/1985 | Biegelsen et al. ............ 357/32 |
| 4,549,273 A | | 10/1985 | Tin .............................. 364/200 |
| 4,590,549 A | | 5/1986 | Burrage et al. ......... 364/200 X |
| 4,594,657 A | | 6/1986 | Byrns .......................... 364/200 |
| 4,604,161 A | * | 8/1986 | Araghi ....................... 156/645 |
| 4,628,436 A | | 12/1986 | Okamoto et al. ....... 364/200 X |
| 4,668,333 A | * | 5/1987 | Tandon et al. .............. 156/633 |
| 4,671,846 A | * | 6/1987 | Shimbo et al. ............. 156/629 |
| 4,682,285 A | | 7/1987 | Ozil et al. ................... 364/200 |
| 4,737,932 A | | 4/1988 | Baba .......................... 364/900 |
| 4,747,060 A | | 5/1988 | Sears, III et al. |
| 4,830,985 A | * | 5/1989 | Araghi et al. ............... 437/209 |
| 4,868,068 A | * | 9/1989 | Yamaguchi et al. ........ 428/596 |
| 4,883,215 A | * | 11/1989 | Goesele et al. ............. 228/116 |
| 4,912,633 A | | 3/1990 | Schweizer et al. .......... 364/200 |
| 4,953,074 A | | 8/1990 | Kanetani et al. ........ 364/132 X |
| 4,961,821 A | * | 10/1990 | Drake et al. ................ 156/647 |
| 4,962,879 A | * | 10/1990 | Goesele et al. ............. 228/116 |
| 4,990,462 A | * | 2/1991 | Sliwa, Jr. ..................... 437/51 |
| 5,045,142 A | * | 9/1991 | Drake et al. ................ 156/278 |
| 5,297,260 A | | 3/1994 | Kametani ................... 395/325 |

FOREIGN PATENT DOCUMENTS

| | | |
|---|---|---|
| GB | 2134676 | 8/1984 |
| JP | 51-54753 | 5/1976 |
| JP | 53-93746 | 8/1978 |
| JP | 54-50329 | 4/1979 |
| JP | 56-145494 | 11/1981 |
| JP | 57-136203 | 8/1982 |
| JP | 57-152065 | 9/1982 |
| JP | 57-162056 | 10/1982 |
| JP | 57-174747 | 10/1982 |
| JP | 58-211271 A | 12/1983 |
| JP | 59-220821 | 12/1984 |
| JP | 60-33643 | 2/1985 |
| JP | 60-120484 | 6/1985 |
| JP | 60-173655 A | 9/1985 |
| JP | 60-254358 A | 12/1985 |
| JP | 61-11876 A | 1/1986 |
| JP | 61-52767 A | 3/1986 |
| JP | 62147746 * | 7/1987 |
| JP | 1205457 | 8/1989 |
| JP | 2184063 * | 7/1990 |
| JP | 2189961 | 7/1990 |
| JP | 3062588 * | 3/1991 |
| JP | 3214764 * | 9/1991 |

OTHER PUBLICATIONS

*Nikkei Microdevices*; Nikkei, Mc Graw–Hill Inc., Apr. 1, 1986, pp. 45–46.*

*Hitachi Microcomputer General User's Guide*; Feb. 1991, p. 121.*

Lowenthal, Richard, "Floating Point Microprocessor Implemented as Optional Co–Processor", *Computer Design*, Mar. 1981, vol. 20, No. 3, pp. 178–182.

Wyland, David C., "Dual–Port RAMs Simplify Communication in Computer Systems", Application Note AN–02, *Integrated Device Technology, Inc.*, 1986.

"CMOS Dual Port RAM", Preliminary Specification IDT71305, *Integrated Device Technology, Inc.*, 1985, pp. 1–87, 1–74–1–75.

"Nachrichtentechnik Elektronik", 1979, vol. 29, No. 7, pp. 271–276.

"Electronics Design", Jul. 26, 1984, pp. 155–166.

*Webster's Ninth New Collegiate Dictionary*, copyright 1986 by Marriam–Webster, Inc., p. 938.

* cited by examiner

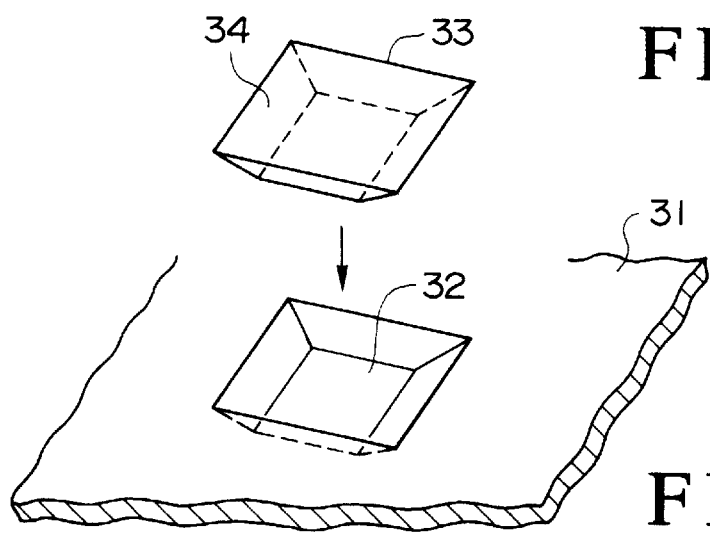
FIG.21A
FIG.21B
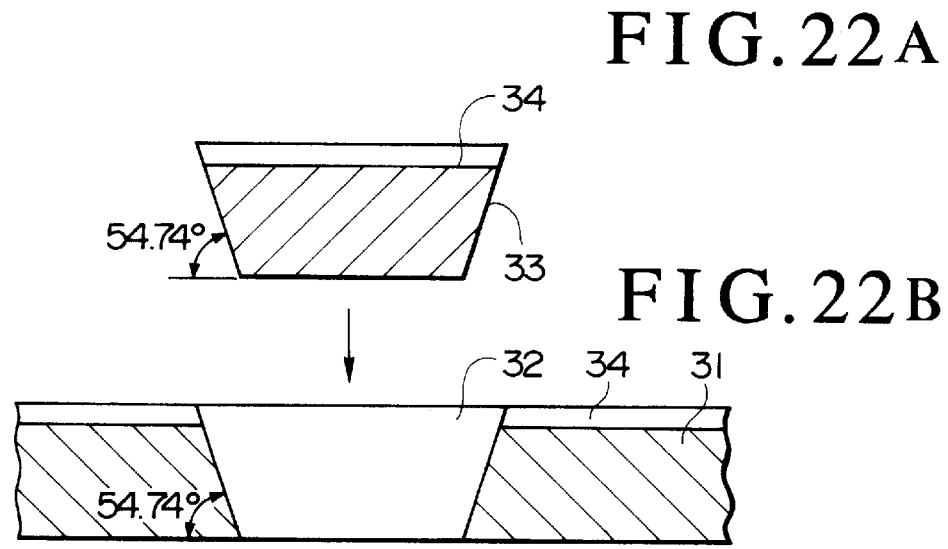
FIG.22A
FIG.22B

FIG. 33A
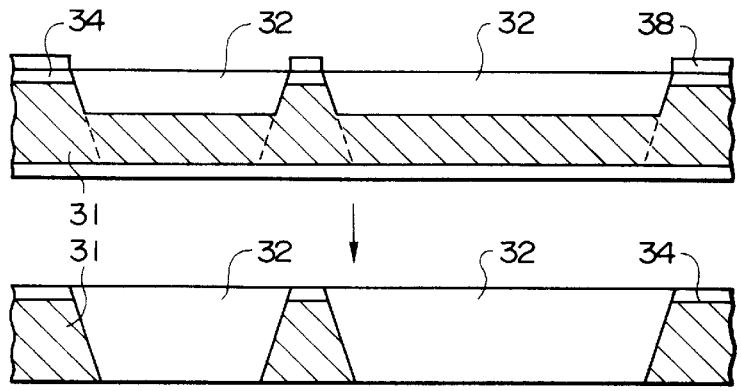
FIG. 33B
FIG. 34
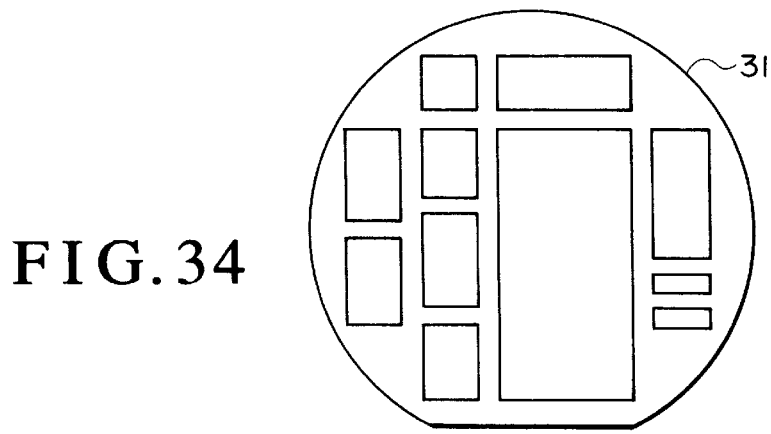
FIG. 35
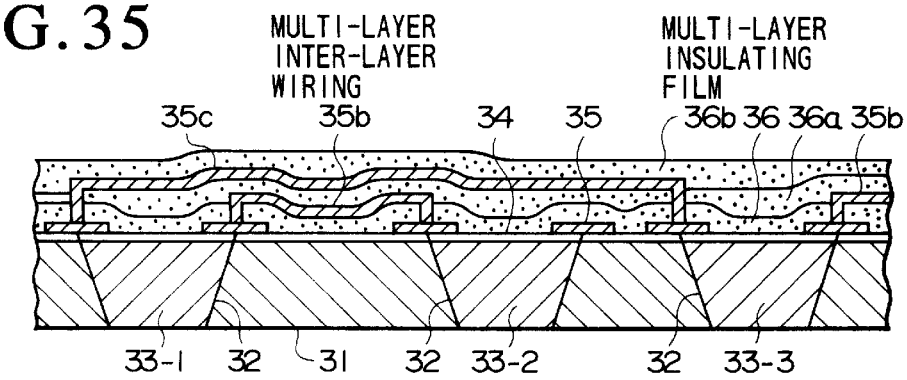

(III) FACE GROOVES FROM BOTH SURFACES

EMBODED CHIPS COATED
WITH ELECTRIC CONTACT 33b

ELECTRICALLY CONDUCTIVE FILM 39

TRACE OF DEFECTIVE CHIP

SEMICONDUCTOR DEVICE AND METHOD FOR FABRICATING THE SAME

CROSS-REFERENCES TO RELATED APPLICATIONS

This application is a Continuation-in-part of application Ser. No. 07/636,562, filed Jan. 7, 1991, now U.S. Pat. No. 5,297,260 which is a Continuation of application Ser. No. 07/471,801, filed Dec. 15, 1989, now abandoned which is a Continuation of application Ser. No. 07/013,548, filed Feb. 11, 1987now abandoned. The contents of the applications are incorporated herein by reference.

BACKGROUND OF THE INVENTION

The present invention relates to a semiconductor device which is optimal to provide a large wafer area and a large number of functions formed on the wafer or less number of parts to be fabricated, and a method for fabricating it. The semiconductor device according to the present invention is suitable to realize a large capacity and high performance.

Heretofore, a semiconductor device has been required to have plural functions such as functions of arithmetic, storage and input/output on its monolithic chip. But an increase in the chip area leads to a considerable reduction in the fabrication yield so that such requirement has been dealt with by curtailing each function and reducing the area occupied by each function.

Thus, the semiconductor device has been constructed with each function made lower than the case where a single chip has a single function. Its one example is the Hitachi "HD 401220" which is an; eight-bit single chip microcomputer described in HITACHI MICROCOMPUTER GENERAL USER'S GUIDE Feb. 1991 page 121.

This microcomputer has many functions including a 2048-byte ROM, 32-byte EEPROM, timer, D/A converter and I/O port. The performance of each function is inferior to that in the system including the Hitachi "HD 64180" which is an; eight-bit microcomputer and the Hitachi "HM 514102"which is a 4 megabyte DRAM. The technology of combining plural chips to form a single semiconductor device is disclosed in JP-A-2-184063.

The former technology, in which each function is made lower than in the case of the single-chip single-function, is not suitable to the case where upgraded functions are required.

The latter technology, in which the gaps necessarily generated between chips are filled with resin, cannot be applicable to a high temperature process. The reason why the gaps are generated is that the chips etched by isotropic etching or insufficient anisotropic etching are combined.

Conventional defect relief technology for LSI with the scale of a semiconductor substrate is disclosed in e.g. (1) "NIKKEI MICRODEVICE" April 1986, pages 45–46 issued Apr. 1, 1986 by Nikkei McGraw-Hill Inc., and (2) JP-A-62-147746.

The reference (1) makes an explanation of the defect relief technology for the integrated circuit with the scale of a substrate. Its summary is as follows. First, poor device areas of device areas on the substrate are removed, and at the removed areas planar square holes each penetrating from the principal surface of the substrate to the back surface thereof are formed. Secondly, the substrate, under the state where the principal surface is directed downward, is placed on a prescribed pedestal. Subsequently, defect-free semiconductor elements chips, under the state where their principal surface is directed downward, are inserted or mounted in the holes. The size of the defect-free element chips inserted in the holes is e.g. 4.99 mm square or so. Thereafter, the gaps between the defect-free element chips and the substrate are filled with resin such as epoxy resin. Finally, the substrate is turned over and wirings are made between the pads of the defect-free element chips and those for the defect-free areas on the substrate, thus completing the integrated circuit.

The reference (2) also describes a defect relief technique for integrated circuits. Like the reference (1), in this technique also, defective element areas on a substrate are removed and defect-free element chips are inserted in the removed areas; thereafter wirings are made between the element chips to complete an integrated circuit.

In recent years, semiconductor devices have been advanced to provide large capacity and upgraded function. Also the element chips included in the device have advanced to provide upgraded function and large size. But if the element chips are made large-sized, the number of element areas which can be formed on the substrate will be reduced. In addition, if the element chips are made large-sized and also highly integrated, the defect production rate will be increased owing to alien substances. As a result, the number of defect-free element chips which can be acquired from a single substrate will be greatly decreased.

Thus, it is expected that realizing the large capacity and upgraded function of the semiconductor device makes it very difficult to assure the element production yield profitable in cost. The method which may reduce the number of defect-free element chips which can be acquired from a single semiconductor substrate to one or less cannot be used for the production of the semiconductor device. From such a standpoint, as a future trend of the semiconductor devices, an important problem to be solved is to provide a method of fabricating a semiconductor device with high production yield or realizing defect relief with high reliability.

Further, in recent years, development and fabrication of custom products for semiconductor devices have advanced. The custom products are fabricated in accordance with the specification requested by a user by the number required by him. Thus, the number of the kinds of products is increased whereas the number of products for each kind is not increased. As a result, reduction in the production cost for the products due to mass-production cannot be expected. The cost of the products will greatly depend on the element production yield. In order to assure the element yield profitable in cost, the defect relief technique with high reliability is required as in the above case.

In the conventional techniques disclosed in the above references (1) and (2), defective element chips cannot be easily removed and defect-free element chips cannot be precisely positioned when they are to be mounted on a substrate so that the wiring method of connecting the elements with the substrate is problematic. The conventional techniques, as they are, cannot be adopted as relief technique for elements.

SUMMARY OF THE INVENTION

An object of the present invention is to. provide a method for fabricating a large-sized semi-conductor device with high yield and a highly reliable defect relief technique for it.

Another object of the present invention is to provide a semiconductor device with plural functions which are formed on a single chip and not inferior to those in the case of a single-chip single-function.

Still another object of the present invention is to provide a semiconductor device which can grant a user's request of desiring to fabricate the semiconductor device at low cost although the production amount thereof is little and can be fabricated at low cost without deteriorating the function.

A further object of the present invention is to provide a semiconductor device which is applicable to a high temperature process even when it is composed of plural chips.

The present invention provides a semiconductor device in which the side wall (inner peripheral surface) of the concave portion or through-hole formed in a semiconductor substrate and the side walls (outer peripheral surfaces) of the semiconductor element chip are fit to each other in their face contact; otherwise semi-conductor chips are connected with each other in the face contact of their side walls.

In this specification, (a b c), (-a -b -c), (-a -b c), (-a b -c), (a -b -c), (-a b c), (a -b c), (a b -c) are defined as the "same crystal face" as each other and those can be described as {a b c}. Further, (111), (-111), (1-11), (11-1), (-1-11), (-11-1), (1-1-1), (-1-1-1) are generally called {111}; therefore, e.g., (111) face and (-1-11) face are the same face as each other and are {111}.

In accordance with one aspect of the present invention, there is provided a semiconductor device having a combination of plural semiconductor chips.

Specifically, the semiconductor device with plural semiconductor chips combined according to the present invention has the plural semiconductor chips in each of which a semiconductor element is to be formed on a semiconductor substrate surface so that each element is formed on the same surface side, and has any of the following features.

(1) Plural chips are combined with their sides kept in face-contact to each other to form a sheet of wafer.

(2) Plural chips are combined with their sides having the same inclination angle kept in face-connection with each other to form a sheet of wafer.

(3) Plural chips are combined with their sides having the same crystal face kept in face-connection to form a sheet of wafer.

(4) Plural chips are combined with their sides kept in face-contact to each other to form a sheet of wafer, and a pad plate is arranged on the back surface opposite to the surface on which elements are to be formed.

(5) In item (3), the crystal face of the sides is a {111} face.

(6) In item (4), the back surface and the pad plate are bonded by bonding agent.

(7) Plural kinds of semiconductor chips are combined with their sides kept in face-contact to each other to form a sheet of wafer, and they are selected from the group consisting of chips having a central processing function, a storage function and an arithmetic function, incorporating a light receiving element and an light emitting element, having a sensor function, constituting a mere electric signal transmission means between the chips and having a movable portion, respectively.

(8) Plural kinds of semiconductor chips are combined with their sides kept in face-contact to each other, and the atoms of semiconductor material on the contact face are coupled with each other directly or through oxygen atoms.

The method for fabricating a semiconductor device according to the present invention has any of the following features.

(9) Plural chips in each of which a semiconductor element is to be formed on a semiconductor substrate surface are combined to form a sheet of wafer so that each semiconductor element is formed on the same surface side are combined, and opposite junction faces are parallel to each other.

(10) Sides of plural chips in which semiconductor elements are formed on their semiconductor substrate surface are subjected to anisotropic etching, and the etched sides are joined to connect the plural chips.

(11) In item (10), an etching solution for etching includes an alkaline solution such as KOH, NaOH, CsOH and $NH_4OH$; an organic solution such as ethylene diamine, hydrazine, choline; and a quaternary ammonium solution such as tetramethylammonium hydroxide tetraethylammonium hydroxide.

(12) Plural chips in each of which a semiconductor element is to be formed on a semiconductor substrate surface are combined so that each semiconductor element is formed on the same surface side, and their faces for connection are bonded at temperatures of 400° C. or more. (13) In any of items (9) to (12), an electrically conductive film is formed so that it extends over the edge of a semiconductor chip and that of another semi-conductor chip, and in accordance with the connection format of wirings, the film is cut to be divided by any of techniques of laser, ion-beam, plasma and electron beam.

(14) In any of items (9) to (12), the position of the wiring to be connected with each semiconductor chip is recognized, and the path of projecting laser light in a laser CVD device is determined so that the position does not interfere with other wirings.

(15) In any of items (9) to (12), location or its order of the wirings serving to connect plural semi-conductor chips with each other are standardized for all of the plural semiconductor chips.

In the present invention, after element chips are fabricated to have a size smaller than the conventional chip size and defect-free elements are selected, the semiconductor substrates of the selected element chips are connected with each other so that the surfaces on which the elements are to be formed are in the same surface side. This permits semiconductor devices to be fabricated within the conventional production yield.

The fabricating method according to the present invention permits many-kind small-amount production by fabricating plural kinds of element chips and changing the combination thereof in accordance with the request of a customer.

Now, the component chip means a semiconductor chip which is a component of the semiconductor device according to the present invention, and is composed of a semiconductor substrate and a surface on which an element is to be formed. The component includes concepts of both cases where the surface layer itself of the semiconductor substrate shares a semiconductor element function and another semiconductor function portion is formed on the surface of the semiconductor substrate.

The present invention provides the following meritorious effects.

(i) It is possible to fabricate large-sized semi-conductor devices without reducing their production yield.

(ii) It is possible to construct on a single chip a plurality of functions which are not inferior to that in the case of single-chip single function.

(iii) Many-kind small-amount production can be realized at low cost.

In accordance with another aspect of the present invention, there is provided a semiconductor device in which a semiconductor element chip is fit in the concave or penetrating portion (through-hole) in a semiconductor substrate.

The present invention is directed to the structure and fabrication method of a semiconductor device composed of a semiconductor substrate having at least one groove or penetrating portion with its side walls each encircled by a {111} crystal plane (hereinafter referred to as "sides in the {111} plane") and a semiconductor element chip with its sides in the {111} plane which fits in the groove and penetration porion.

The present invention is directed to a defect relief technique of replacing a semiconductor defective element by a defect-free element chip.

In order to realize the fabricating method with high yield or defect relief technique with high reliability, a method of fabricating a semiconductor device may be used which removes, by anisotropic etching, the defective portion of a semiconductor integrated circuit element with its sides in the {111} plane formed on a semiconductor substrate, and embeds, in the removed portion, a defect-free element chip with its side walls in the same {111 } plane formed by the same etching, thereby completing a semiconductor integrated circuit.

The anisotropic etching uses the property of Si crystal that the etching speed for the {111} plane with the highest atomic density is much slower (1: several tens to several hundreds) than that for other {100} and {100} faces.

The solution having the anisotropic property for Si includes a KOH solution and ethylenediamine catechol solution. Since the angle formed by these crystal planes can be determined precisely, using e.g. the Si substrate with a {100} plane, the crystal face with an inclined {111} side wall having an angle of about 54.74° from it can be formed.

For the above reason, if the defective portion of the semiconductor integrated circuit element formed on a semiconductor substrate is removed by anisotropic etching, an removed area with its sides in the {111} plane is formed.

The defect-free element chip with its sides in the same {111} plane formed by the same anisotropic etching is fit in the removed area to be embedded therein.

As described above, the {111} plane has been formed at a precise angle, the defect-free element chip is precisely fit in the removed area. So the element chip to be fit can be easily positioned and positioning error which the prior art involves is not generated.

If the function of a large-sized semiconductor device is divided to form small-sized element chips and the small-sized element chips are integrated to form the large-sized semiconductor device, the large-sized device can be formed with high yield.

The feature of the semiconductor device according to the present invention can be selected from any of the following items.

(16) The semiconductor device is composed of a semiconductor element chips and a semiconductor substrate having a concave portion or a penetrating portion in which the semiconductor element chip fits, and the side walls of the semiconductor element chip which constitutes at least one fitting face and those of the semiconductor element have the same crystal plane.

The concave portion or penetrating portion may be a groove or a through-hole and may be located at any position in the semiconductor substrate so that it may be located at the edge of the semiconductor substrate, and in this case, one side of the semiconductor element chip is exposed (hereinafter, this applies in the description of the specification).

(17) In item (16), the concave portion or penetrating portion has an upper shape of square, its four sides have the same crystal face, the corresponding element has an upper shape of square, and its four sides have the same crystal face.

(18) In item (16), each side of the fitting portion is a tapered face.

(19) The semiconductor device is composed of plural semiconductor elements and a semiconductor substrate having plural concave portions or penetrating portions in which the respective semiconductor elements fit, and the side walls of the semiconductor element constituting at least one fitting face of plural fitting faces and those of the semiconductor substrate have the same crystal face.

(20) In item (19), each concave portion or penetrating portion has an upper shape of square, its four side walls have the same crystal face, each corresponding element has an upper shape of square, and its four side walls have the same crystal face.

The shape is desired to be a parallelogram, but the present invention should not be limited to it; this shape may be a polygon such as a hexagon and an octagon (hereinafter, this applies in the description of the specification).

(21) In item (19), each side of each fitting portion is a tapered face.

(22) The semiconductor device is composed of a semiconductor substrate having at least one groove or penetrating portion with its sides in the {111} face, a semiconductor element with its sides in the {111} face fit in the groove or penetrating portion and a wiring of electrically connecting the semiconductor element with the semiconductor substrate.

(23) The semiconductor device is composed of a semiconductor substrate having plural groove or penetrating portions each with its sides in the {111} face, a plurality of semiconductor elements with its sides in the {111} face each fit in each of the groove or penetrating portion and a wiring of electrically connecting the semiconductor elements with the semi-conductor substrate.

(24) The semiconductor device is composed of a semiconductor substrate having plural grooves or penetrating portions, each with its sides in the {111} face, having different sizes, and a plurality of semi-conductor elements, each with its sides in the {111} face, each fit in each of the grooves or penetrating portions, and a wiring of connecting the semiconductor elements with the semiconductor substrate.

(25) In item (22), (23) and (24), the semiconductor device further includes an insulating film covering the semiconductor substrate, semiconductor element(s) and wiring.

(26) The semiconductor substrate as a component has at least one groove or penetrating portion with its sides in the {111} crystal face.

(27) The semiconductor element as a component has sides in the {111} face.

(28) The semiconductor device is composed of a semiconductor substrate having at least one groove or. penetrating portion with its sides in the {111} face, a semiconductor element with its sides in the {111} face fit in the groove or penetrating portion and the semi-conductor element is connected with the semiconductor substrate by direct bonding by thermal oxidation without using bonding agent.

(29) The semiconductor device is composed of a semiconductor substrate having at least one groove or penetrating portion with its sides in the {111} face, a semiconductor element with its sides in the {111} face fit in the groove or penetrating portion and a wiring of electrically connecting the semiconductor element with the semiconductor substrate, and the wiring connects electrodes provided on the semiconductor element and semiconductor substrate by means of wirings.

(30) The semiconductor device is composed of a semiconductor substrate having plural groove or penetrating portions each with its sides in the {111} face, a plurality of semiconductor elements each with its sides in the {111} face, each fit in each of the groove or penetrating portions, and a wiring of electrically connecting the plurality of semiconductor elements with the semiconductor substrate, and the wiring is a multi-layer inter-element wiring connecting the semiconductors with each other and covered with a multi-layer insulating film.

(31) The semiconductor device is composed of a semiconductor substrate having at least one groove or penetrating portion with its sides in the {111} face in its both front and back surfaces, a semiconductor element with its sides in the {111} face fit in the groove or penetrating portion from the front and back surfaces, a wiring of electrically connecting the semiconductor elements with the semiconductor substrate and an insulating film for covering the semiconductor substrate, semiconductor element and wiring.

(32) In item (30), an electrically conductive film is made on the side and bottom of each of the semi-conductor elements with its sides in the {111} face fit in the concave portion or penetrating portion from the front and back surfaces of the substrate so that the semiconductor elements on the front and back surfaces of the substrate are electrically connected.

(33) The defective area of the semiconductor element formed on the semiconductor substrate is removed to form at least one concave with its sides in the {111} face or penetrate through the substrate, and a defect-free element with its sides in the {111} face fit in the removed area is embedded in the removed area.

(34) In Item (33), a wiring for electrically connecting the defect-free element substituted for the defective element with the semiconductor substrate is provided, and an insulating film for covering the semiconductor substrate, semiconductor element and wiring is provided.

(35) An insulating film for an etching margin is formed between semiconductor elements on a semiconductor substrate, the defective area of each semiconductor element formed on the semiconductor substrate is removed to form at least one concave with its sides in the {111} face or penetrate through the substrate, a defect-free element with its sides in the {111} face fit in the removed area is embedded in the removed area, a wiring for electrically connecting the defect-free element substituted for the defective element with the semi-conductor substrate is provided, and an insulating film for covering the semiconductor substrate, semiconductor element and wiring is provided.

(36) Where there are plural areas of defective elements in the same substrate, the defective elements are removed to form concave each with its sides in the {111} face or penetrate through the substrate, defect-free elements each with its sides in the {111} face fit in the removed area is embedded in the removed areas, wirings for electrically connecting the defect-free elements substituted for the defective elements with the semiconductor substrate is provided, and an insulating film for covering the semiconductor substrate, defect-free semiconductor element and wirings is provided.

(37) A defective element is formed into at least one groove with its sides in the {111} face, and a defect-free element with its sides in the {111} face fit in the depth of the groove is embedded in the groove.

(38) A defective element is formed into at least one concave with its sides in the {111} face or penetrating portion from the front and back surfaces of a substrate, and a defect-free element with its sides in the {111} face fit in the concave or penetrating portion is embedded in the groove and fixed there by bonding agent from the back surface where no element area is located.

(39) A defective element of semiconductor elements formed on a semiconductor substrate is formed into at least one concave portion with its sides in the {111} face or penetrating portion, and a defect-free element with its sides in the {111} face fit in the concave or penetrating portion is embedded in the portion so that the defect-free element and the surface of the semi-conductor substrate are located at the same height.

(40) In any of items (16) to (40), the semiconductor substrate is made of a material (e.g. Si, Ge and GaAs) which can be subjected to anisotropic etching.

(41) In any of items (16) to (40), wet etching or dry etching is carried out using an etching solution such as a KOH solution and ethylenediamine catechol solution.

(42) The semiconductor substrate is removed to form at least one concave portion with its octahedral sides in the {111} face or penetrate therethrough thereby to form a semiconductor element with its sides in the {111} face fit in the removed area being octahedral, and the semiconductor element has the sides being at least one fitting face of the fitting sides and the side of the semiconductor substrate are in the same crystal face.

(43) The semiconductor substrate is removed to form at least one concave portion with its pentahedral sides in the {111} face or penetrate therethrough thereby to form a semiconductor element with its sides in the {111} face fit in the removed area being pentahedral, and one side of the pentahedron is used as a positioning face.

According to the present invention, removed areas each with its sides in the {111} face are formed on the element area of a semiconductor substrate by anisotropic etching, and semiconductor elements each with its sides in the {111} face formed by the same anisotropic etching are embedded in the removed areas.

Specifically, removed areas each with its sides in the {111} face and a different size are formed on the element areas of the semiconductor substrate, and the semiconductor elements with its sides in the {111} face in conformity with these sizes are formed and embedded in the removed areas having the different sizes. Thus, the semiconductor elements having different sizes can be simultaneously formed on one sheet of semiconductor substrate, and so custom products can be fabricated by the number requested by users.

In accordance with the present invention, in the initial stage of the substrate process, i.e., the stage when the defect occurring rate is high because of the fineness and high integration of the device, only defective areas in element areas can be removed to be easily modified. Further, if small-sized defect-free elements are previously incorporated in a substrate having grooves or through-holes each with sides in the {111} face and electric wirings are made among the elements, large-sized semiconductor elements can be fabricated with high production yield.

The semiconductor device according to the present invention provides the following representative meritorious effects.

(i) Removed areas each with its side walls in the {111} face having different sizes are formed on the element areas of the semiconductor substrate, and small-sized semiconductor elements each with its side walls in the {111} face in conformity with these sizes are formed and embedded in the removed areas having the different sizes, a large-sized semiconductor substrate can be formed.

(ii) In the initial stage of the substrate process, i.e., the stage when the defect occurring rate is high because of the fineness and high integration of the device, only defective areas in element areas can be removed to be easily modified.

For example, the following thing can be realized.

First, semiconductor elements are formed until the first wiring step by most advanced process technology. If any defective element has been generated, the corresponding area is removed and a defect-free element is arranged in the removed area. In this way, defect relief can be surely performed without deteriorating the performance of a semiconductor integrated circuit device, thereby enhancing the element production yield. Because of the effects of the above (i) and (ii), reduction in the yield of the elements due to the large-scaling and high integration of the semiconductor integrated circuit device can be restrained, and the requirement for large capacity and high grade function can be satisfied. Thus, it is possible to advance to realize the computer system by a single element.

Since defects are cured before the semi-conductor integrated circuit at the element area acquires its function and immediately after the defect has been found, defect relief with high applicability and reliability can be realized. As a result, the present invention can deal with customizing of semiconductor devices.

The fabricating method according to the present invention has the following features.

(44) In the method of fabricating a semiconductor device including plural Si substrates kept in contact with each other and of making the wiring for connecting the plural Si substrates, an electrically conductive film is formed to extend over the edge of a certain Si substrate and another Si substrate kept in contact with it, and the film is cut by laser so that it conforms with the connection format of the wiring.

(45) In the method of fabricating a semiconductor device including plural Si substrates kept in contact with each other and of making the wiring for connecting the plural Si substrates, the metallic film used for the wiring is made parallel to that of an adjacent metallic film.

(46) In item (44) or (45), the film is cut using the means selected from the group including ion beams, plasma and electron beams.

(47) In the method of fabricating a semiconductor device including plural Si substrates kept in contact with each other and of making the wiring for connecting the plural Si substrates, the position of the wiring to be connected with each semiconductor substrate is recognized, and the path of projecting laser light in a laser CVD device is determined so that the position does not interfere with other wirings. The excitation energy source should be not limited to the laser, but may be ion beams or electron beams. The wiring may be formed on the surface area of the Si substrate other than the surface area thereof where elements are to be formed.

(48) In any of items (44) to (47), a silicon oxide film or organic film is formed in the neighborhood of contact positions of the Si substrate after the Si substrates are brought into contact.

When body chips are fit into chips to be embedded, their relative positions fluctuate owing to processing variations and positioning accuracy in fitting. If an optimum wiring layout is made in accordance with the recognized state of each of the chips having fluctuation, poor connection of the wiring can be evaded. For example, if the uniform film is cut into an optimum shape in conformity with that of each chip as in the above item (44), the wiring in conformity with each chip can be surely formed.

Further, if the projection path of laser light is determined in accordance with each chip in the laser CVD technique as in the above item (47), the optimum wiring for each chip can be made.

When body chips are fit into chips to be embedded, gaps or level differences may be produced. If the film for flattening is provided as in the above item (48), the level differences can be reduced and the gaps can be embedded, thereby surely making the wiring.

The fabricating method according to the present invention (1) permits the yield of semiconductor devices to be improved and (2) permits the wiring for the semi-conductor device to be surely made, thereby improving its reliability.

BRIEF DESCRIPTION OF THE DRAWINGS

FIGS. 21A and 21B are a three-dimensional view of the semiconductor device according to the tenth embodiment of the present invention;

FIGS. 22A and 22B are sectional views of FIGS. 21A and 21B;

FIGS. 33A and 33B are sectional views for explaining a semiconductor device fabricated according to the nineteenth embodiment of the present invention;

FIG. 34 is a plan view for explaining a semi-conductor device fabricated according to the twentieth embodiment of the present invention;

FIG. 35 is a sectional view for explaining a semiconductor device fabricated according to the twenty-first embodiment of the present invention;

DESCRIPTION OF THE PREFERRED EMBODIMENTS

Figure 1:
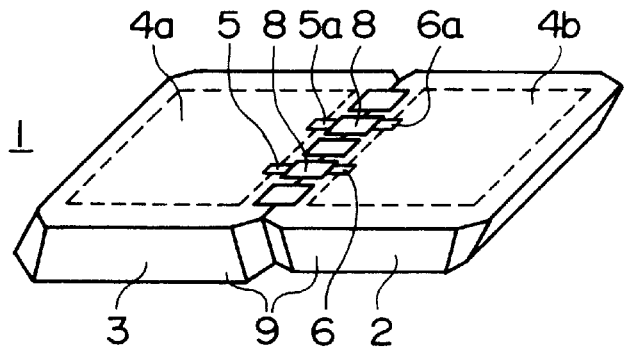
FIG. 1 is a perspective view of the semiconductor device according to the first embodiment of the present invention.
Figure 2:
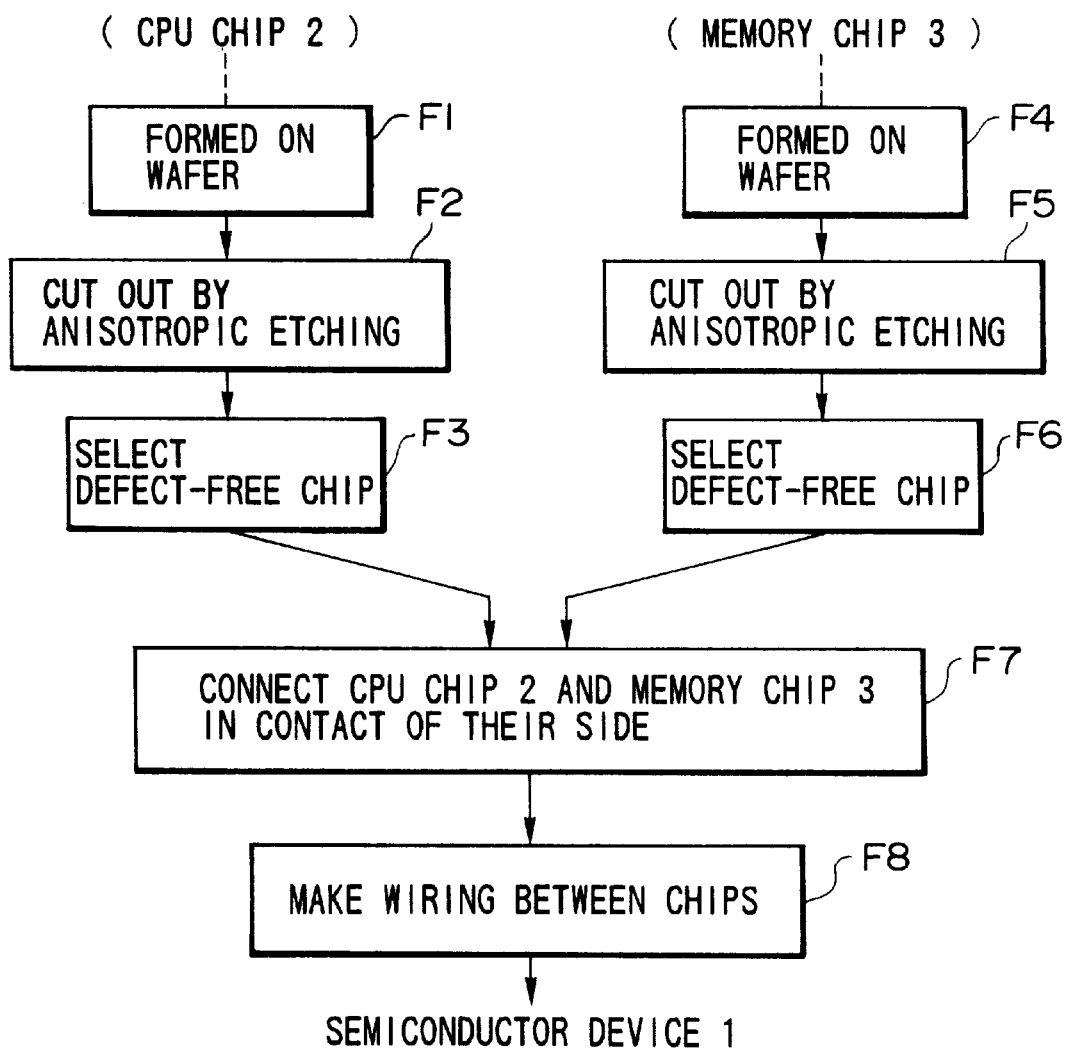
FIG. 2 is a flowchart showing the process for fabricating the semiconductor device according to the first embodiment of the present invention.

Now referring to FIGS. 1 to 5, an explanation will be given of the structure and fabricating method of a semiconductor device according to the first embodiment of the present invention. The semiconductor device include a plurality of element chips, each of which includes at least one element. FIG. 2 is a flowchart of the fabricating process.

Figure 3:
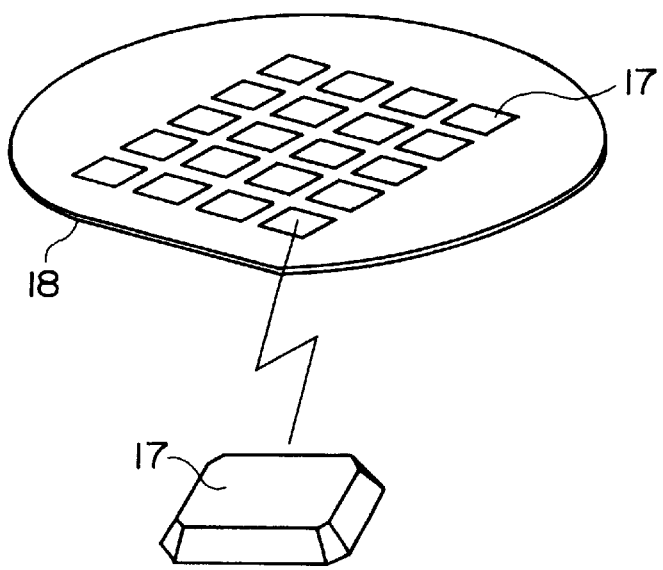
FIGS. 3 to 5 are perspective views for explaining a step in the process for fabricating the semiconductor device according to the first embodiment of the present invention, respectively.

First, a CPU (central processing unit) chip 2 and a memory chip 3 each as element chip having a memory circuit are respectively fabricated on wafers 18 (see FIG. 3) by the conventional semiconductor device fabricating processes including a photolithography process, a film deposition process and an etching process (Steps F1, F4 in FIG. 2). It should be noted that as shown in FIG. 1, the chips 2 and 3 have, in their ends, pads 5, 6 and 5a, 6a, respectively, which are connected with each other by wirings 8. As shown in FIG. 3, element chips 17 such as the CPU chip 2 and the memory chip 3 are cut out from the wafer 18 by anisotropic etching (Steps F2, F5 in FIG. 2). In this etching, only an area 4 (4a, 4b) on the chip where an element has been formed (hereinafter referred to as an element area), is masked by an etching mask made of, for example, $SiO_2$ or $Si_3N_4$ so that it is not eroded. There is preferably used etching solution which has great anisotropy so as to expose the close-packed crystal plane {111} (inclusive of the planes of (111), (11-1), (1-11), (-111), (1-1-1), (-11-1), (-1-11) and (-1-1-1), the same is applied to the following description) of a semiconductor substrate 9. Such etching solution is preferably an alkaline solution such as KOH, NaOH, CsOH and NH$_4$OH or an organic solution including ethylene diamine, hydrazine, choline or a quaternary ammonium solution such as tetramethylaimonium hydroxide or tetraethylammonium hydroxide. Assuming that the element area is on a {100} plane and the longer edge of the element chip 17 is on a <110> axis, the side plane {100} at of the element chip 17 is also etched so that the resultant element chip 17 has a cut-off corner, as shown in FIG. 3. If the etching mask is previously formed considering this cutting-off, the chip shape would be able to be controlled. In order to form a semiconductor device 1 with the CPU chip 2 and memory chip 3 being brought into contact with each other at the outer side plane, one chip must have the front surface including the element area 4 (4a, 4b) larger than the back-surface whereas the other chip must have the front surface smaller than the back surface. For this purpose, it is preferable that the etching advances from the front surface for the one chip and the back surface for the other chip. Thus, since, the anisotropic etching is used for formation of the outer surfaces of the element chip 17 to expose the close-packed crystal plane, when the semiconductor device 1 is formed with these faces being in contact or combination with each other between the outer surfaces is so very less, the gap due to unevenness or unsmoothness of the outer surfaces to occur in the contact face, thus minimizing the displacement between the component chips from their appropriate positions.

In the semiconductor device thus formed, a plurality of element chips are so arranged that the surfaces their element areas are coincided with each other. Namely, both the semiconductor chips are connected with their sides made in parallel to each other so that they are combined with the sides having the same inclination angle brought into face contact with each other. The inclination angle (angle at the acute angle portion) of each chip given by the anisotropic etching is a constant value, e.g., about 54.74° in the case of Si.

The anisotropic etching is used based on the fact that the etching speed for the {111} face which is the closest-packed plane in Si crystal is much slower than that for other faces (e.g. (100) face). The semiconductor material to be used is required to be such a material as can endure the anisotropic etching. In addition to Si, Ge and GaAs may be used. The anisotropic etching can be performed with great accuracy by controlling the concentration of the etching solution and the etching temperature. For example, in the case of Si, the KOH 44 wt % etching solution at 50° C. gives an etching rate of 0.2 $\mu$m/min.

The function of each chip is examined, and the defective CPU chips 2 and memory chips 3 are removed. Thus, only defect-free products are selected (Steps 3, 6 in FIG. 2).

Figure 4:
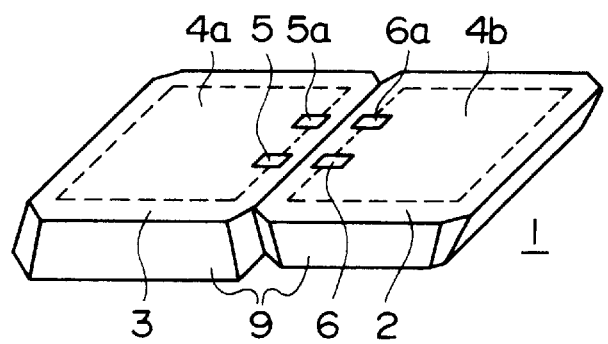

As shown in FIG. 4, the CPU chip 2 and memory chip 3 having a memory circuit are so arranged that their element areas 4a and 4b have the corresponding element surfaces in the neighborhood. In this case, the closest-packed planes ({111} planes) of the CPU chip 2 and memory chip 3 are brought into contact with each other (Step F7 in FIG. 2).

Thus, since the chips are arranged so that their element areas 4a and 4b are located in the same plane, the wires 8 of connecting the pads 5 and 6 and pads 5a and 6a have the shortest distance. The device thus formed can be dealt easily with as a single chip. In this way, the wiring is made between the CPU chip 2 and the memory chip 3 (Step F8 in FIG. 2).

Then, the contact faces may be bonded in such a manner that they are pressure-bonded to each other at 400° C. or more. This bonding results in connection of atoms in the bonding face of the CPU chip 2 with those in the bonding face of the memory chip 3 through oxygen atoms. Otherwise, at the high temperature range of 800° C. or more, the bonding face of the CPU chip 2 is connected with that of the memory chip 3 directly.

Figure 5:
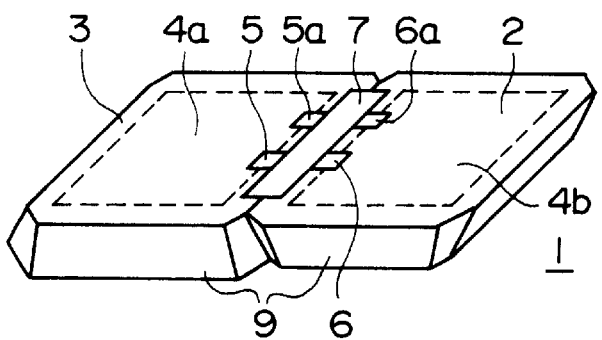

Next, as shown in FIG. 5, an electrically conductive film 7 is formed to cover the pads 6, 6a of the CPU chip 2 and the pad 5, 5a of the memory chip 3.

Further, as shown in FIG. 1, the film 7 is partially burned off to provide optimum paths using laser so that the connected pads 5 and 6 are isolated and insulated from the connected pads 5a and 6a, thus forming connection wirings 8. In this case, it should be noted that the output of the laser is optimized so that heat by radiation of the laser does not give damages such as crystal defects to the semiconductor substrates 9.

The relative positions of the pads 6, 6a of the CPU chip 2 to pads 5, 5a of the memory chip 3 are to be recognized in selecting the laser radiated paths by human eyes or an automatic image recognition technique. For example, where the pads 5 and 6 are to be connected, after their positions are recognized, the laser radiated paths are determined go that the connected pads 5 and 6 are isolated and insulated from the pads 5a and 6a. In order to burn off the film 7 to form the connection wirings 8, focused ion beams, plasma or electron beams may be used in place of the laser.

According to this embodiment of the present invention, after the CPU chips 2 and memory chips 3 are fabricated separately and defective chips of them are removed, wirings are made for the defect-free chips so that they can be connected with each other. Thus, the semiconductor device 1 having a large chip area can be obtained with no great reduction in the production yield.

As a result, a plurality of functions can be achieved on a single chip as compared to the case of a single-chip single-function.

Further, if the CPU chips 2 having different functions and the memory chips 3 having different memory capacities are previously fabricated, their combinations can provide semiconductor devices having several functions and memory capacities. In short, many-kind small-amount production can be realized.

Figure 6:
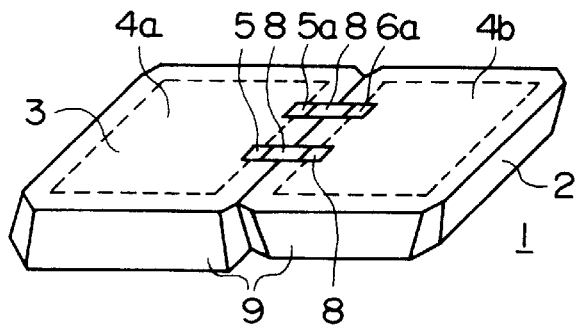
FIG. 6 is a perspective view for explaining a step in the process for fabricating the semiconductor device according to the second embodiment of the present invention.

The structure according to this embodiment of the present invention is shown in FIG. 6. In FIG. 6, like reference numerals refer to like parts in FIG. 1. In this embodiment, the laser CVD method is used to form the connection wirings S.

The laser beam radiated paths are selected after the relative positions of the pad 6 of the CPU chip and the pad 5 of the memory chip 3 are recognized. When the laser beam is radiated along the selected paths in an atmosphere of a raw material gas for the laser CVD, the energy of the laser beam can resolve the gaseous molecules of the raw material gas to deposit free atoms (molecules) along the laser beam-radiated regions or paths. As the excitation energy source, ion beams or electron beams may be used instead of the laser.

Figure 7:
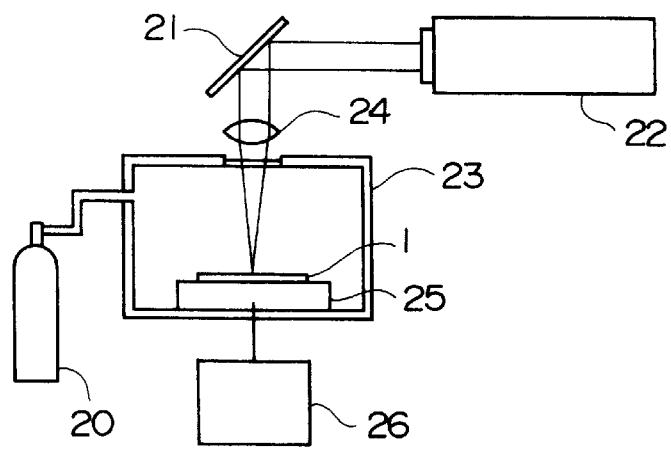
FIG. 7 is a schematic diagram for explaining an apparatus used for wiring for the semiconductor device according to the present invention.
Figure 8:
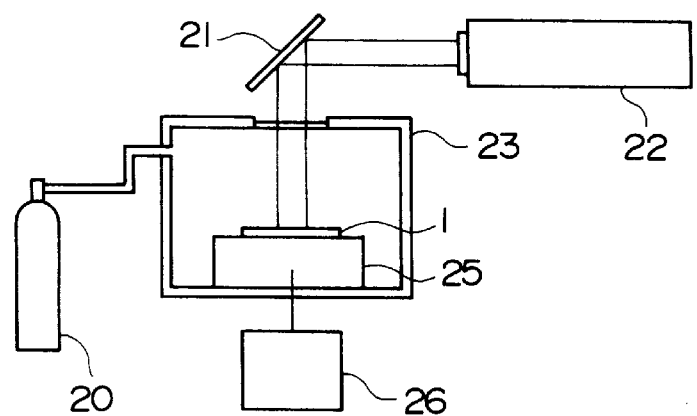
FIG. 8 is a schematic diagram for explaining another apparatus used for wiring for the semiconductor device according to the present invention.

FIG. 7 schematically shows a film deposition apparatus using the laser CVD (chemical vapor deposition). Where fine wirings are to be formed, the apparatus having such a structure as shown in FIG. 7 is desirable. But such a structure as shown in FIG. 8 may be adopted. The present CVD deposition apparatus is composed of a raw material gas cylinder 20, a mirror 21, a laser oscillator 22, a chamber 23, an objective lens 24, a movable stage 25 and a stage controller 26.

In operation, the light emitted from the laser oscillator 22 is reflected on the mirror 21 and converged by the objective lens 24. Thereafter, the laser beam is introduced into the chamber 23 and radiated onto the semiconductor device 1 on the movable stage 25. The movable stage 25 is controlled by the stage controller 26 so that the laser beam can be radiated onto any portion of the semiconductor device. The raw material gas is previously introduced from the gas cylinder 20 into the chamber 23.

The material which can form the wirings 8 by the laser CVD method includes Cu, Au, Zn, Cd, Al, Ga, In, Ti, Cr, Mo, W, Ni, Pt, Si, C, Ge and Sn.

The raw material gas and the corresponding laser used will be shown in Table 1.

heated at 400° C. or more so that the CPU chip 2 and memory chip 3 are pressure-bonded to the base 10. In this case, the base 10 is desired to be made of the same material as that of each element chip so that excessive thermal stress is not exerted between the base 10 and the component chips. It is further desirable that their crystal axes are the same. Thereafter, the same wiring as in the two above-mentioned embodiments is made. Each of the chips 2 and 3 may be bonded to the base 10 using a bonding agent.

In accordance with this embodiment, each chip is bonded to the base 10 so that the resultant semi-conductor device has an excellent mechanical strength and cat be easily handled.

Figure 10:
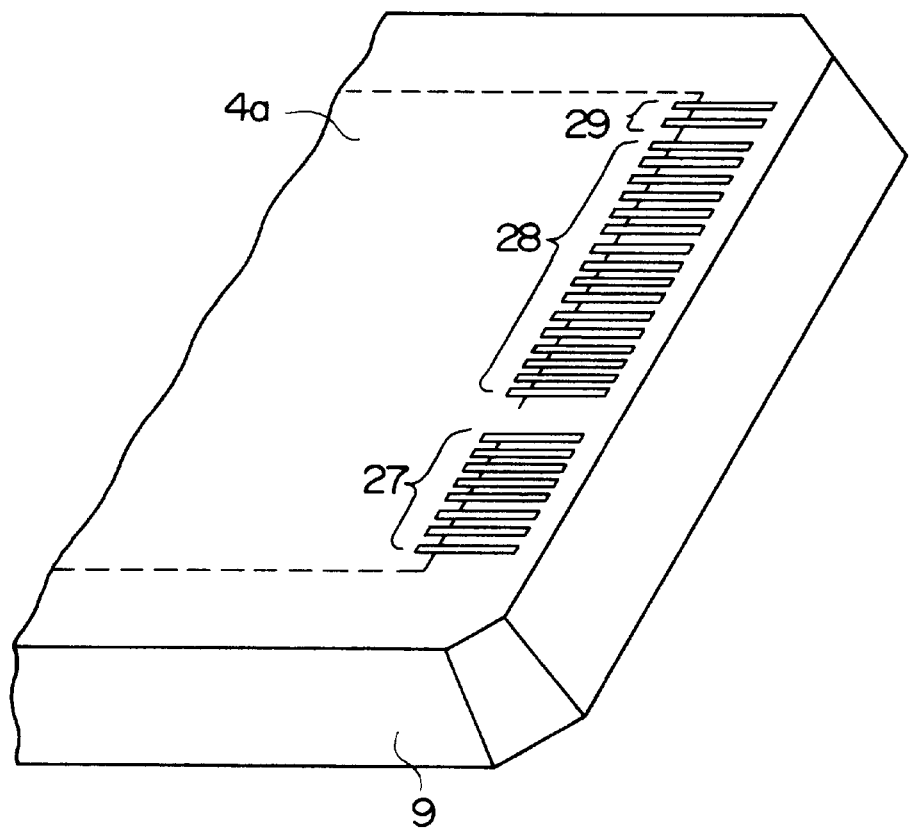
FIG. 10 is a perspective view for explaining a structure of the edge of the semiconductor device according to the fourth embodiment of the present invention.
Figure 11:
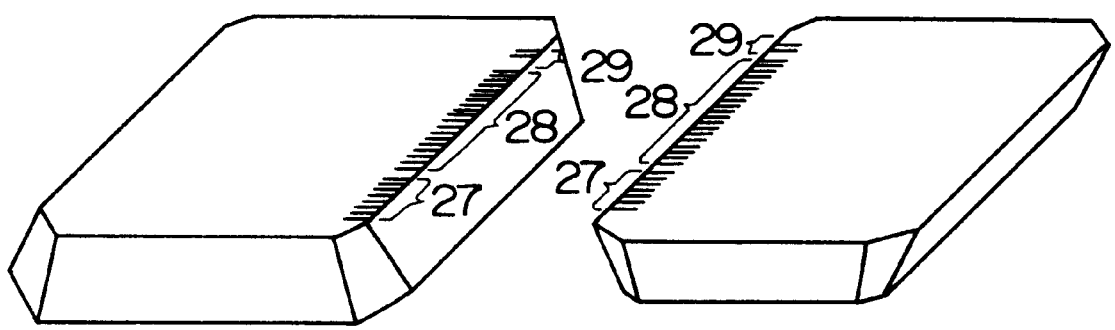
FIG. 11 is a schematic view for explaining the connection structure in the semiconductor device according to the fourth embodiment of the present invention.
Figure 12:
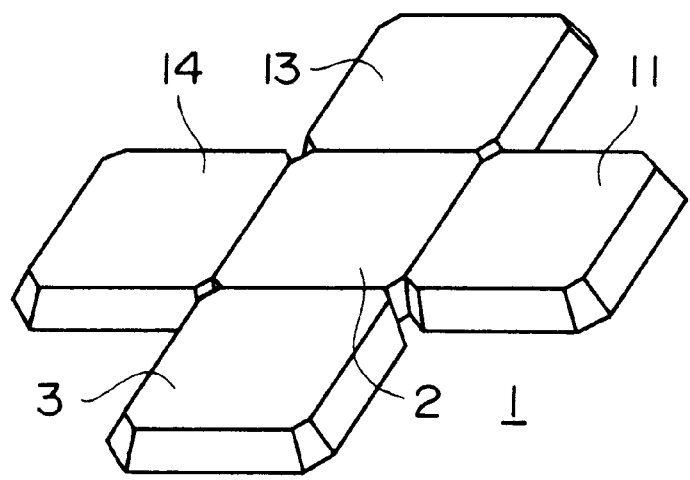
FIG. 12 is a perspective view of the semi-conductor device according to the fifth embodiment of the present invention.

Referring to FIGS. 10 and 11, this embodiment of the present invention will be explained. In this embodiment, the arrangement of the bonding pads such as 5, 6, 5a and 6a to be connected with the connection wirings 8 is standardized. FIG. 11 shows an exemplary manner of arranging the bonding pads according to this embodiment.

In this embodiment, data buses 27, address buses 28 and control signal lines 29 are collectively standardized,

TABLE 1

| Deposition object | Raw material gas | Radiation laser | | | | | | | |
|---|---|---|---|---|---|---|---|---|---|
| | | Ar | Kr | CO$_2$ | ArF | KrF | ArSHG | CuSHG | XeCl |
| Cu | Biss-hexafluoro-pentanedionate | o | o | o | | | | | |
| Au | Au(CH$_3$)$_2$—(CH$_3$COCHCOCH) | o | | | | | | | |
| Al | Al(CH$_3$)$_3$ | | o | | o | o | o | | |
| Ga | Ga(CH$_3$)$_3$ | | | | | | o | | |
| In | In1,In(CH$_3$)$_3$ | | | | o | o | | | |
| Ti | Ti1 | | | | o | o | o | | |
| Cr | Cr(CO)$_6$ | | | | o | o | | o | |
| Mo | Mo(CO)$_6$ | | | | o | o | | o | |
| W | W(CO)$_6$,WF$_6$ | | | | o | o | | o | |
| Ni | Ni(CO)4 | | o | o | | | | | |
| Si | SiH$_4$,Si$_2$H$_6$,SiCl$_4$ | | | | o | o | o | o | o |
| Ge | GeH$_4$,Ge(CH$_3$)$_4$ | | | | o | o | o | | o |

According to the this embodiment wherein the laser CVD method is used, as in the first embodiment, after the CPU chips 2 and memory chips 3 are fabricated separately and defective chips of them are removed, wirings are made for the defect-free chips so that they can be connected with each other. Thus, the semiconductor device 1 having a large chip area can be obtained with no great reduction in the production yield. As a result, a plurality of functions can be achieved on a single chip them as compared with the case of a single-chip single-function. If a level difference occurs between the CPU chip 2 and the memory chip 3, scanning of the laser beam along the level difference permits the connection wiring 8 to be surely formed on the level difference. Namely, this permits a wiring to be surely formed on the silicon substrate other than device areas.

Figure 9:
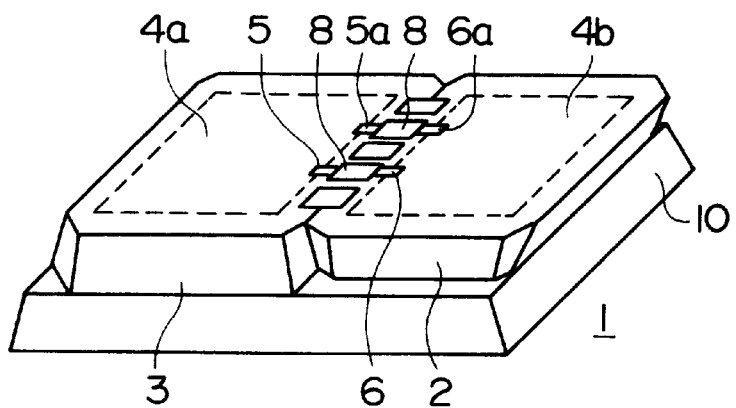
FIG. 9 is a perspective view of the semiconductor device according to the third embodiment of the present invention.

The structure according to this embodiment of the present invention is shown in FIG. 9. In FIG. 9, like reference numerals refer to like parts in FIG. 1. In this embodiment, the CPU chip 2 and memory chip 3 mounted on a pedestal of base 10 made of the same material as the semiconductor substrate 9 are connected or bonded. The method for fabricating a semiconductor device having such a structure will be explained.

First, as shown in FIG. 3, the CPU chip 2 having bonding pads 6, 6a at its end and the memory chip 3 having bonding pads 5, 5a at its end are cut out from a wafer, respectively.

The defect-free CPU chip 2 and memory chip 3 mounted on the base 10, kept in intimate contact with each other, are .respectively. But, a further larger number of bonding pads (wirings) may be standardized in accordance with various uses.

There are two kinds of element chips. One chip as an element area larger than its back surface whereas the other chip has an element area smaller than its back surface. In the two kinds of element chips, the bonding pads are arranged in opposite manners. Namely, as seen from FIG. 11, in the one chip, the bonding pads are arranged on the larger area surface where in the other chip, they are arranged on the smaller area surface. In this way, if the different element chips are connected with or bonded to each other in accordance with their external shapes. The corresponding bonding pads can be connected with no error. Incidentally, a redundant number of data buses 27, address buses 28 and control signal lines 29 are formed for convenience of standardization, respectively, so that some bonding pads do not contribute to the connection of the element chips.

In accordance with this embodiment, the data buses 27, address buses 28 and control signal lines 29 such as clock lines are arranged in a standardized manner so that in making wirings between the element chips, the wirings 8 are not crossed and so information can be transferred with no error between the component chips.

Further, in accordance with this embodiment, the wiring can be made between any chips without considering the order of wiring so that the wiring work can be effectively performed.

In this embodiment, in addition to the CPU chip 2 and the memory chip 3, element chips such as an input/output control chip 11, a laser oscillation chip 13 and a light receiving chip 14 are joined together.

Conventionally, wiring was made for element chips each packaged, so that a large area was required for the wiring. Thus, the entire structure of the complete semiconductor device was bulky. In addition, the delay due to this wiring and an amplifier for driving buses was inevitable.

In accordance with this embodiment, the element chips are united into a single chip so that their element areas 4a and 4b are located in the same plane. Thus, the semiconductor device can be downsized and its high speed can be realized. By combining the element chips in a variety of forms, it is possible to product semiconductor devices in a small amount in response to a customer's request.

Figure 13:
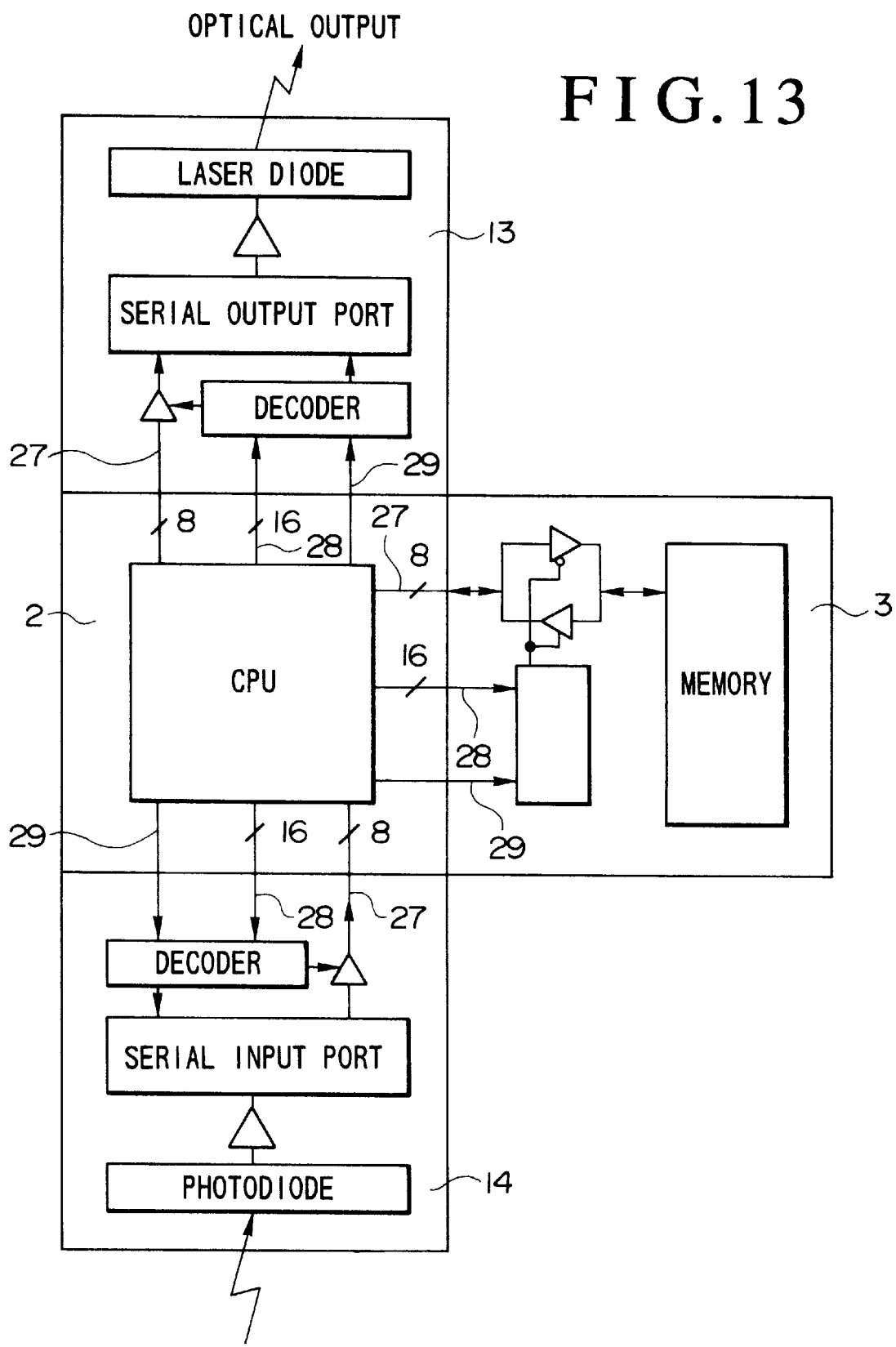
FIG. 13 is a layout view of the semiconductor device according to the fifth embodiment of the present invention.

As shown in FIG. 13, the laser beam outputting chip 13 includes a laser diode, a serial output port and a decoder. The light receiving chip 14 includes a photo-diode, a serial output port and a decoder. In operation, light is incident to the photodiode of the light receiving chip 14 and emitted from the laser diode of the laser beam outputting chip 13.

Figure 14:
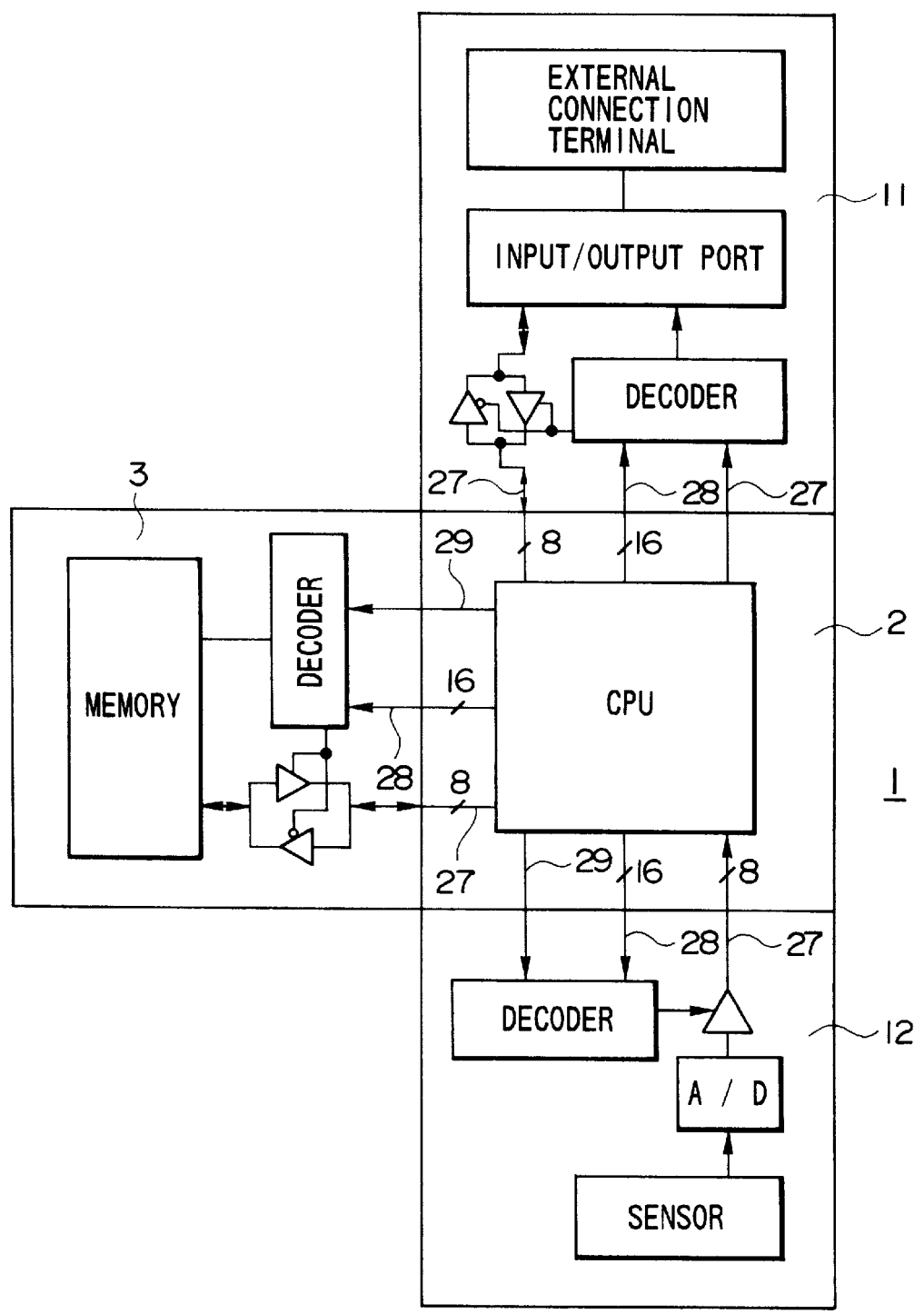
FIG. 14 is a layout view of the semiconductor device according to the sixth embodiment of the present invention.

FIG. 14 shows an arrangement of the semi-conductor device according to this embodiment of the present invention. In this embodiment, the CPU chip 2, the memory chip 3, the input/output control chip 11 and a sensor chip 12 are combined to construct an integrated functions intelligent sensor.

The CPU chip 2 and the memory chip 3 are the same as described in connection with the foregoing embodiments. The memory chip 3 includes a memory and a decoder. The input/output chip 11 includes an external connection terminal, a input/output port and a decoder. The sensor chip 12 includes an A/D converter, a decoder, and a sensor. Reference numerals 8 and 16 denote wirings for connecting the chips.

In operation, the signal sensed in the sensor chip 12, after converted into a digital signal, is transferred to the CPU chip 2 through a data bus 27. The CPU chip 2 can process the input digital signal along the program previously inputted to the memory chip 3 to input or output external information through the input/output control chip 11.

Conventionally, the sensor chip such as a stress sensor was fabricated in a different method from that for a highly-integrated semiconductor chip so that it was difficult to fabricate the sensor chip and the highly-integrated semiconductor chip on the same semiconductor chip. However, in accordance with this embodiment, if the sensor chip and the highly-integrated semiconductor chip fabricated individually are arranged and joined by wiring so that their element areas 4a and 4b are located in the same plane, the semiconductor device thus formed can be dealt with as a single chip.

Figure 15:
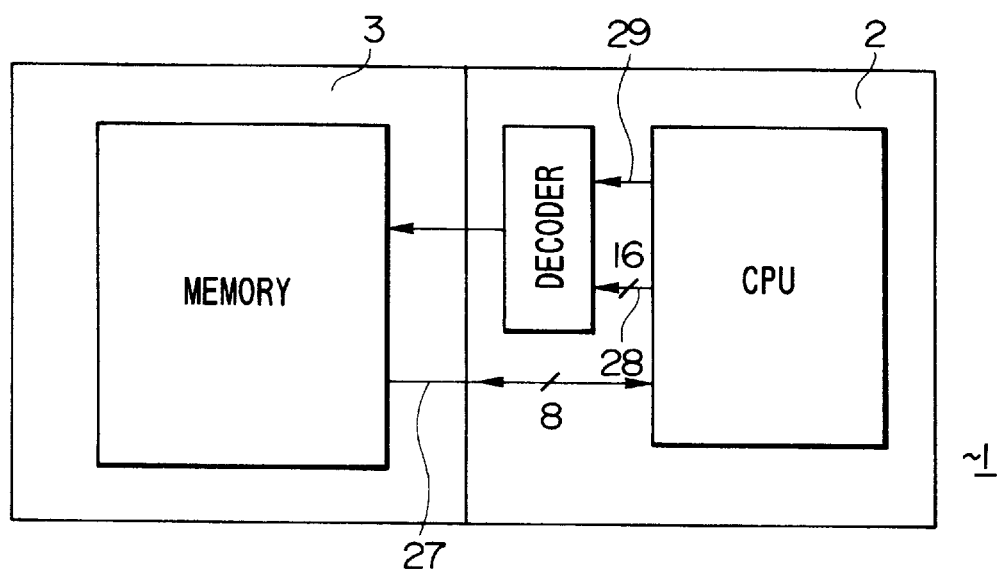
FIG. 15 is a layout view of the semiconductor device according to the seventh embodiment of the present invention.

FIG. 15 shows an arrangement of the semiconductor device according to this embodiment of the present invention. The arrangement according to this embodiment is composed of the CPU chip 2 and the memory chip 3, but a decoder for an address signal is incorporated in the CPU chip 2 so that no bus buffer between the CPU and memory is required.

In accordance with this embodiment, unlike the case where a wiring is externally drawn out, a small driving current is required because of the wiring within a single chip so that the bus buffer can be omitted. Thus, information can be transferred at a higher speed between the CPU chip and the memory chip.

Figure 16:
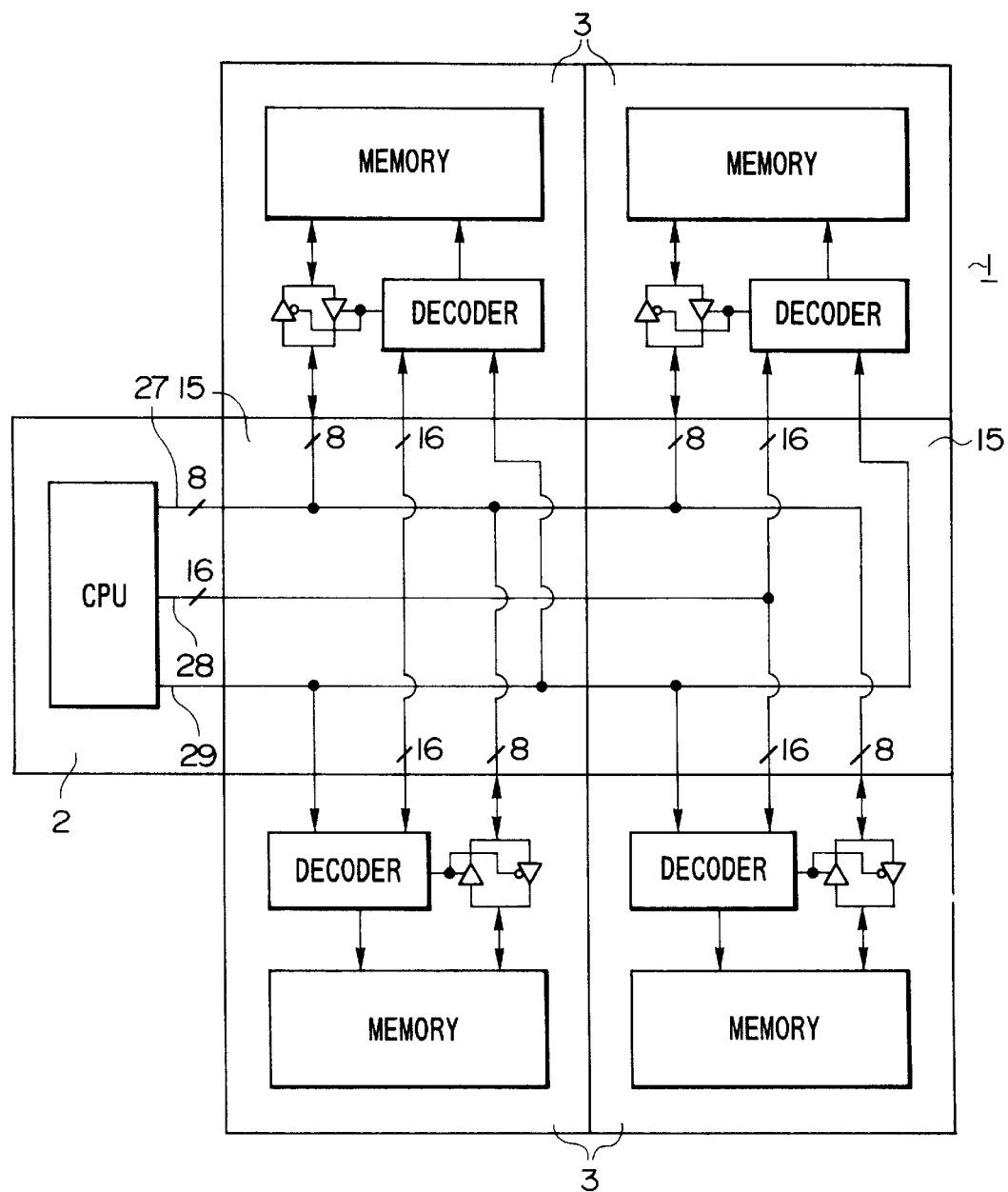
FIG. 16 is a layout view of the semiconductor device according to the eighth embodiment of the present invention.

FIG. 16 shows an arrangement of the semiconductor device according to this embodiment of the present invention. In this embodiment, the element chips are connected through wiring-dedicated chips. For this reason, such an arrangement is more effective for the case where a large number of other element chips are to be connected in parallel with one element chip such as where the CPU chip 2 is connected with the plurality of memory chips 3.

Since the wiring-dedicated chips 15 each serves to branch the data bus 27, the address bus 28 and the line of control signal such as clock, the arrangement according to this embodiment is more effective to connect the wirings such as a data bus 27 from the CPU chip 2 with a large number of the memory chips 3.

Figure 17:
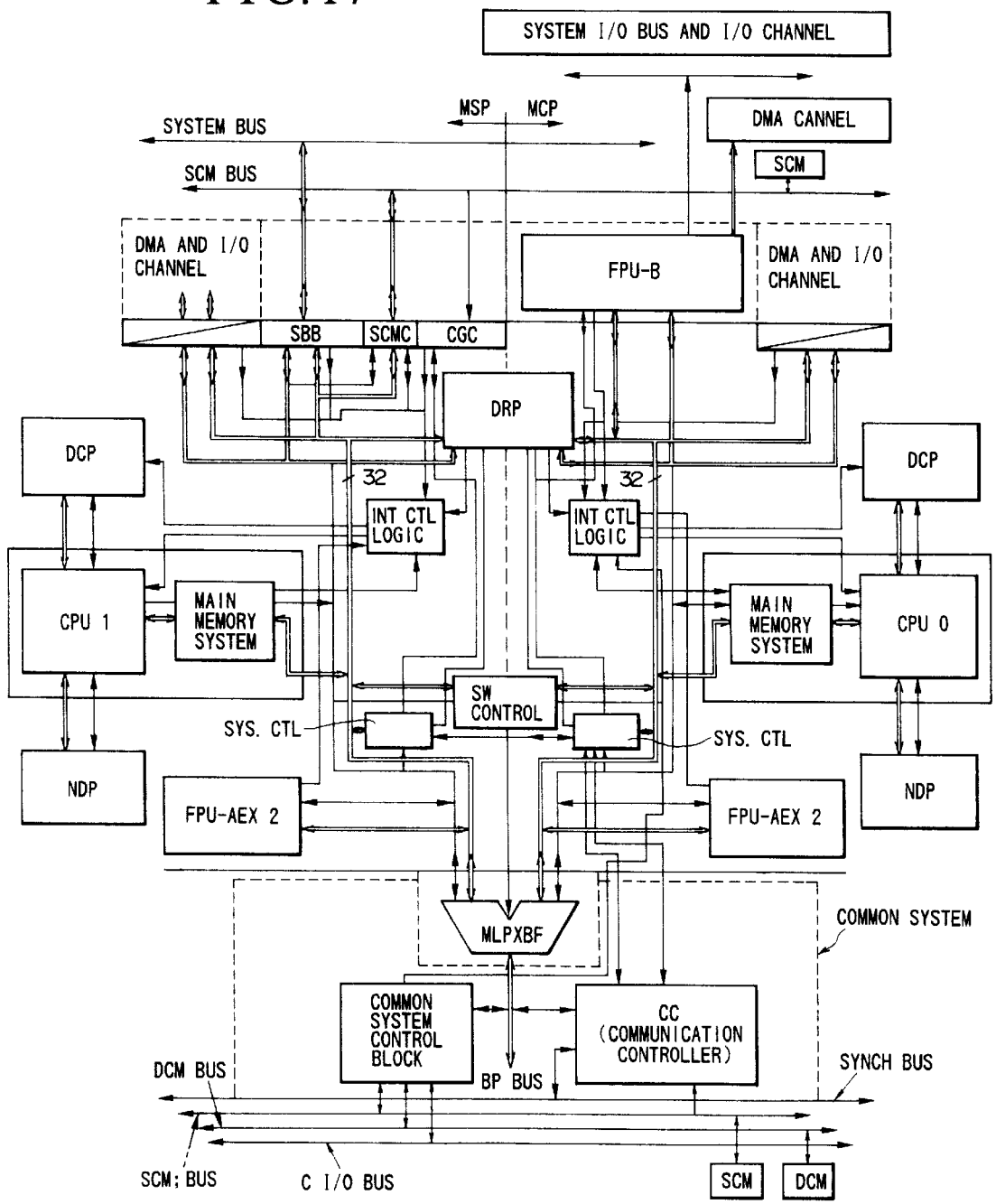
FIG. 17 is a layout view of the semiconductor device according to an application of the eighth embodiment of the present invention.
Figure 18:
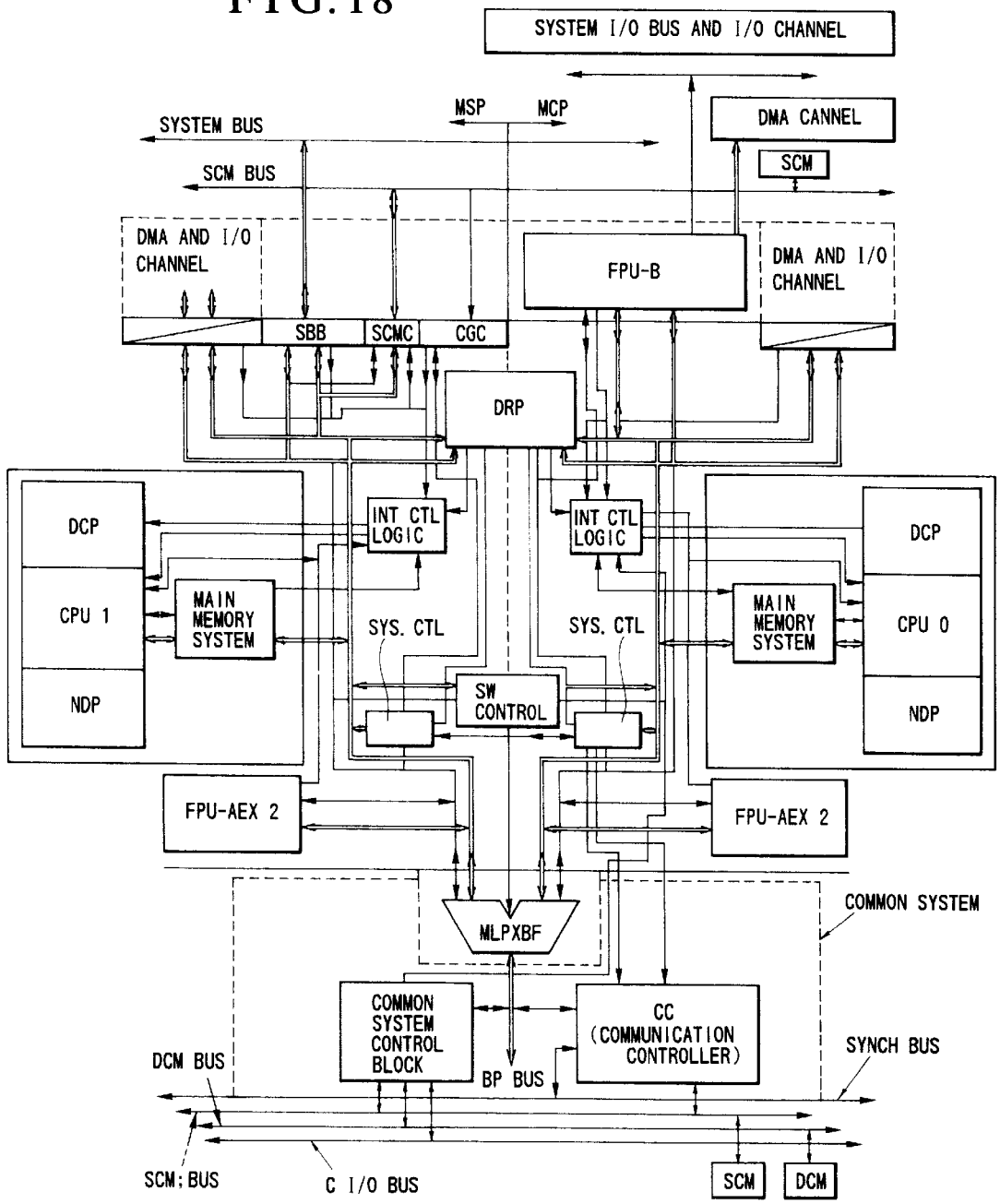
FIG. 18 is a layout view of the semiconductor device according to another application of the eighth embodiment of the present invention.

FIGS. 17 and 18 show one unit of a computer having the conventional multiple CPU system. This system, in which wiring was made between the CPU chip and the memory chip, or between the CPU chip and other chips using long lead lines, required the buffers between the chips.

On the other hand, in accordance with this embodiment, if parts or entirety of the unit are constructed in a single chip, the wirings on the single chip can be made short and no buffer are required. Thus, reduction in the information transfer speed due to long wirings and presence of the buffer can be prevented.

Constructing the parts encircled by bold lines in FIGS. 17 and 18, in which signals are transferred many times, into a single chip is particularly efficient to realize the high speed of the resultant CPU system.

Incidentally, it should be noted that in the example of FIG. 17, the CPU chip and the main memory system chip are joined to form a single semiconductor device whereas in the example of FIG. 18, in addition to these chips, an NDP (Numerical Data Processor) and a DCP (Data Control Processor) are joined to form a single semiconductor device. Since signals are transferred many times between these elements, the arrangement of FIG. 1 is very effective to realize the high speed operation in the resultant semiconductor device.

Figure 19:
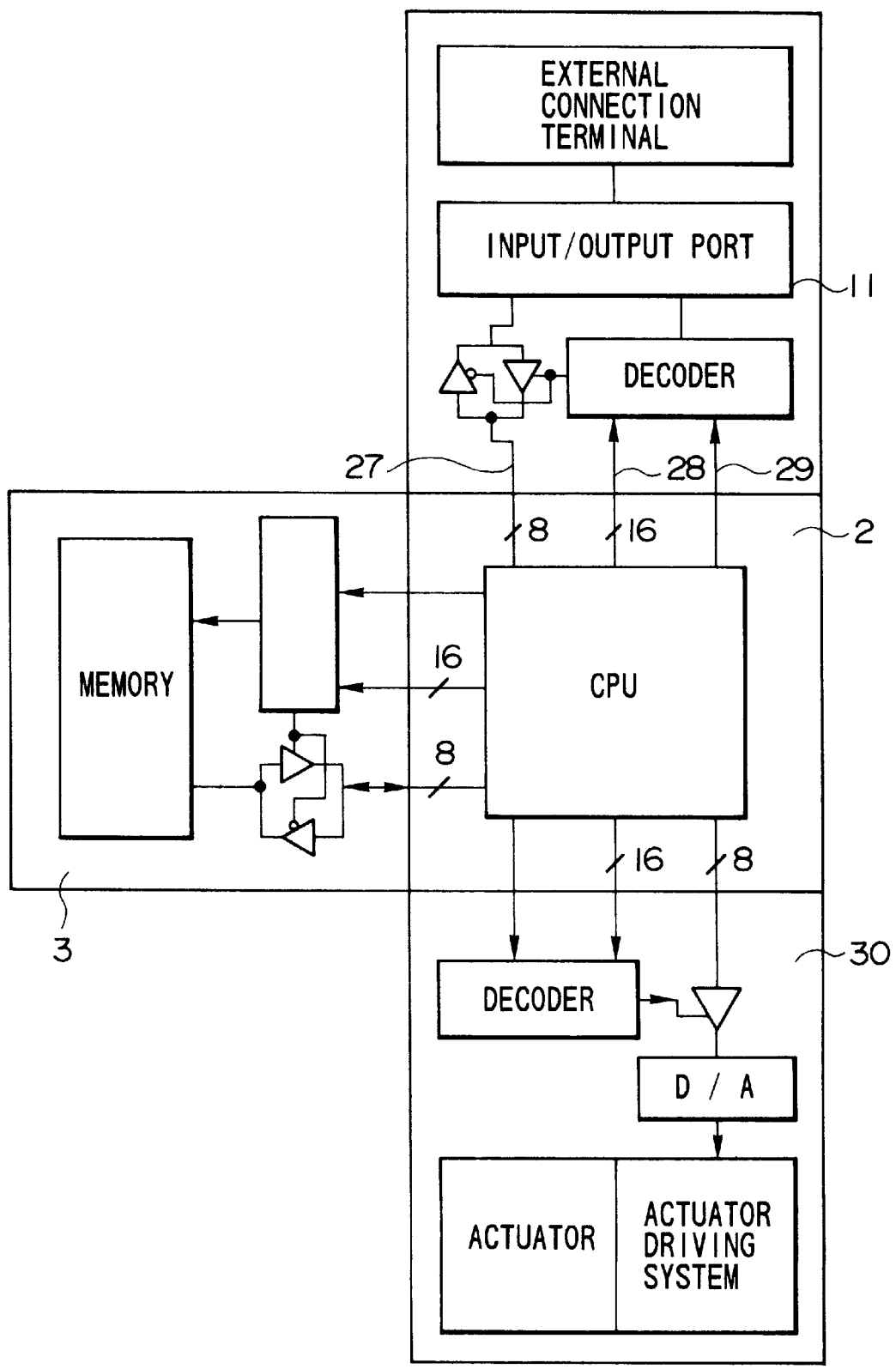
FIG. 19 is a layout view of the semiconductor device according to the ninth embodiment of the present invention.
Figure 20:
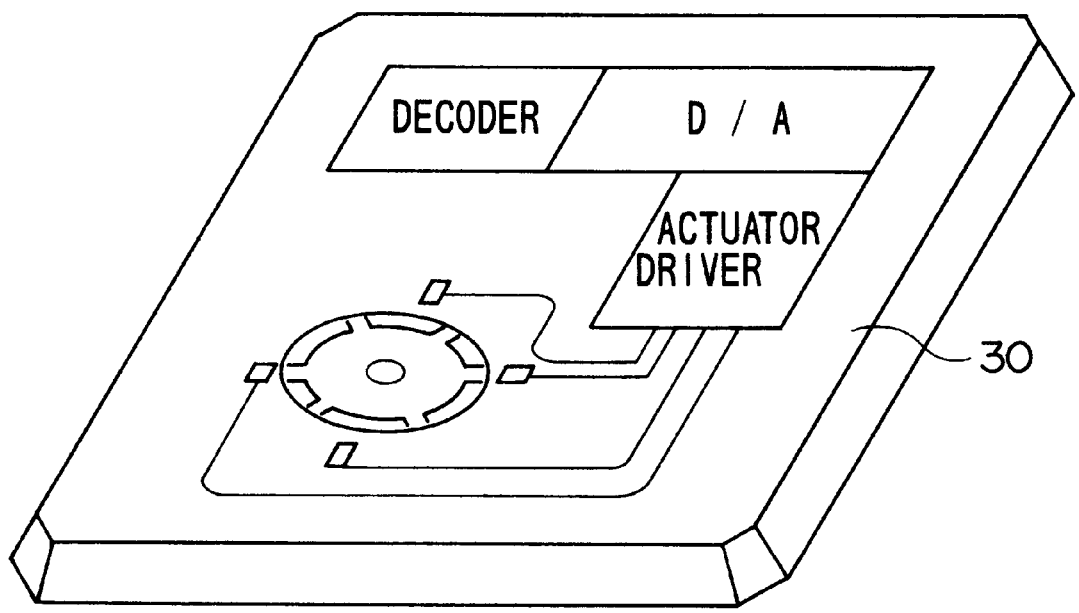
FIG. 20 is a perspective view of an actuator chip for the semiconductor device according to the ninth embodiment of the present invention.

FIGS. 19 and 20 show an arrangement of the semiconductor device according to this embodiment of the present invention. In FIG. 19, like reference numerals refer to like parts in FIG. 14. In this embodiment, an actuator chip 30 fabricated by a micro-machining technique as well as a CPU chip 2, a memory chip 3 and an input/output chip 11 is formed into a single chip. The actuator chip 30 includes a decoder, an actuator, an actuator driver and a D/A converter. FIG. 20 is a perspective view of the actuator chip.

The element chip having an actuator function, i.e., a movable portion may be fabricated by the process which is not compatible with other semiconductor fabrication processes and will deteriorate the performance of a highly-integrated semiconductor device. So, it is difficult to form the element chip having an actuator function and a highly-integrated semiconductor device on a single chip.

However, in accordance with this embodiment, the actuator chip 19 and another highly-integrated chip which were fabricated by different processes can be formed into a single chip. Incidentally, in FIGS. 19 and 20, although the actuator chip 30 includes the decoder, actuator, actuator driver and D/A converter, it is possible to connect the element chip including only a large-sized actuator with the CPU chip 2 through an element chip including the decoder, actuator driver and D/A converter.

FIG. 21 three-dimensionally shows the manner of forming the groove and through-hole 32 having side walls of a {111} crystal face (as described above, hereinafter referred to as "with its sides in the 111} face") on an element area 34 of a semiconductor substrate 31 by anisotropic etching, and fitting in the groove 32 an element (chip) to-be-embedded (hereinafter referred to as simply "embed element") finished to have the same {111} face by the anisotropic etching.

FIG. 22 shows the section of the three-dimensional view of FIG. 21. In the case of an Si substrate, the aninotropic etching forms the element area 34 on the semiconductor substrate 31 into the groove or through-hole 32 having an inclined side wall of the {111} plane at an angle of about 54.74° for the substrate surface. The same anisotropic etching can shape the embed element into a structure having an inclined side wall of the {111} plane at an angle of about 54.74° for its principal surface. For this reason, the embed element can be fit in the groove 32 having the same size as the element chip. Thus, the surface level of the semiconductor substrate 31 completely agrees with that of the embed element 31.

Figure 23:
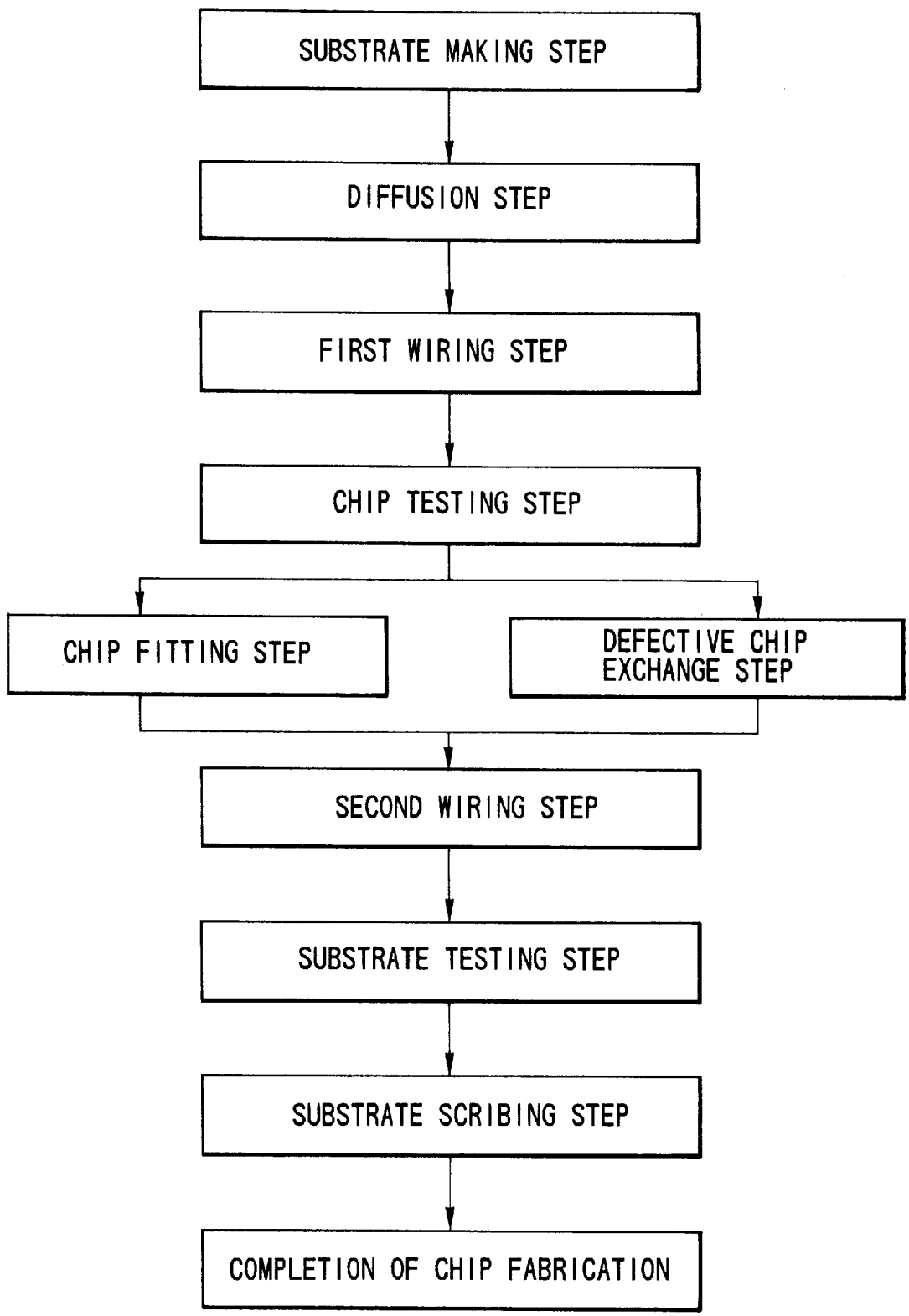
FIG. 23 is a flowchart of a process for fabricating the semiconductor device according to the present invention.

FIG. 23 shows a fabrication process of the semiconductor device according to this embodiment. The fabrication process includes successive eight steps of substrate fabrication, diffusion, first wiring, element testing, element fitting or defective element exchange, second wiring, substrate testing and substrate scribing.

Figure 24:
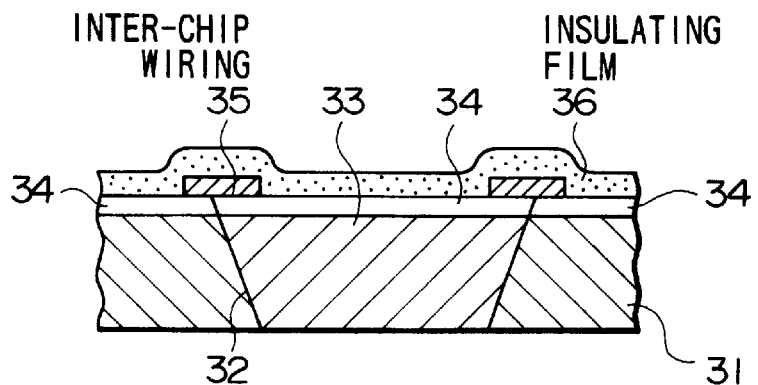
FIG. 24 is a sectional view of the semiconductor device according to the eleventh embodiment of the present invention.

As shown in FIG. 24, in this embodiment, after the embed element 33 with its sides in the {111} plane is fit in the grove and through-hole 32 with its sides in the {111} plane, wirings 35 are made between the element areas and the wirings are covered with an insulating film 36 for protecting them.

The embed element 33 may be fit in and bonded to the groove and through-hole 32 using a direct bonding technique by thermal oxidation without using a bonding agent.

Figure 25:
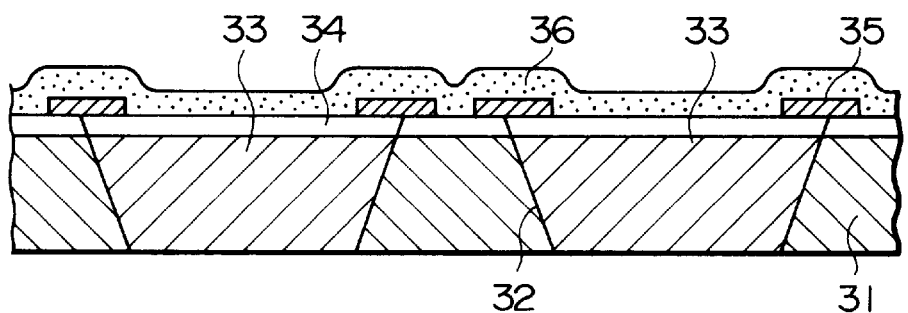
FIG. 25 is a sectional view where plural elements are to be fit in FIG. 24.

As shown in FIG. 25, in a modification of this embodiment, after plural embed element chips 33 each with its sides in the {111} plane are fit in plural groves and through-holes 32 each with its sides in the {111} plane, respectively, wirings 35 are made between the device areas and the wirings are covered with an insulating film 36 for protecting them.

Figure 26:
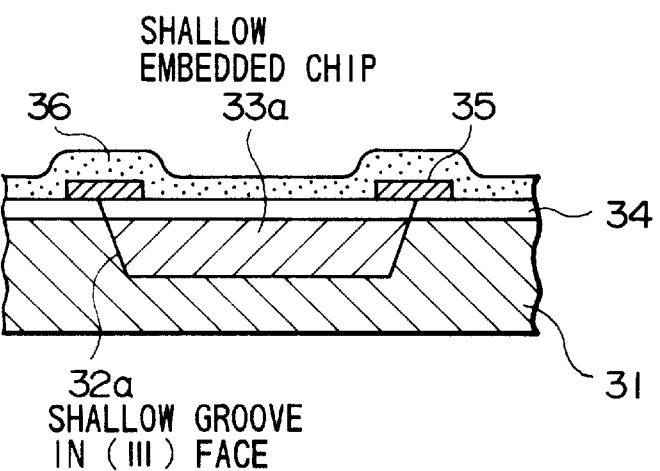
FIG. 26 is a sectional view of the semiconductor device according to the twelfth embodiment of the present invention.

As shown in FIG. 26, in this embodiment, after a thin embed element chip 33 with its sides in the {111} plane is fit in a shallow grove 32 with its sides in the {111} plane, wirings 35 are made between the element areas and the wirings are covered with an insulating film 36 for protecting them. The anisotropic etching in a depth direction can be performed with great accuracy by controlling the concentration and etching temperature of an etching solution. For example, a KOH etching solution of 44 wt % at 50° C. provides an etching rate of 0.2 µm/min.

Figure 27:
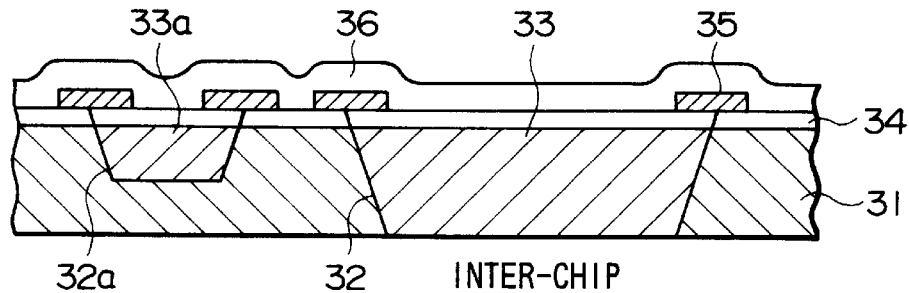
FIG. 27 is a sectional view of the semiconductor device according to the thirteenth embodiment of the present invention.

As shown in FIG. 27, in this embodiment, two cases are combined where the thin embedded element chip 33 with its sides in the {111} plane is fit in the grove 32 with its sides in the {111} plane and where the embed element chip 33 with its sides in the {111} plane is fit in the grove and through-hole 32 with its sides in the {111} plane.

Figure 28:
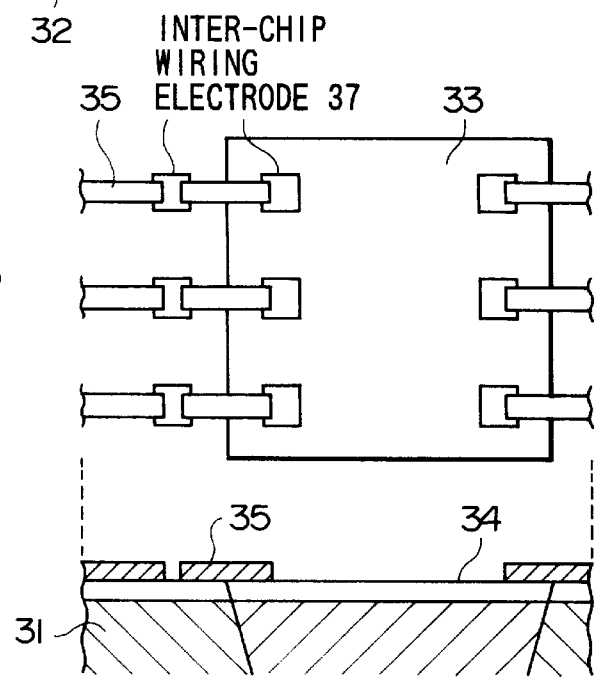
FIG. 28 is a view for explaining inter-element wiring electrode according to the fourteenth embodiment of the present invention.

As shown in FIG. 28, in this embodiment, after an embed element chip 33 with its sides in the {111} plane is fit in the grove and through-hole 32 with its sides in the {111} plane, electrodes 37 for wiring between element areas 34 are made within each device area 34, and wirings 35 for the electrodes 37 are made.

Figure 29:
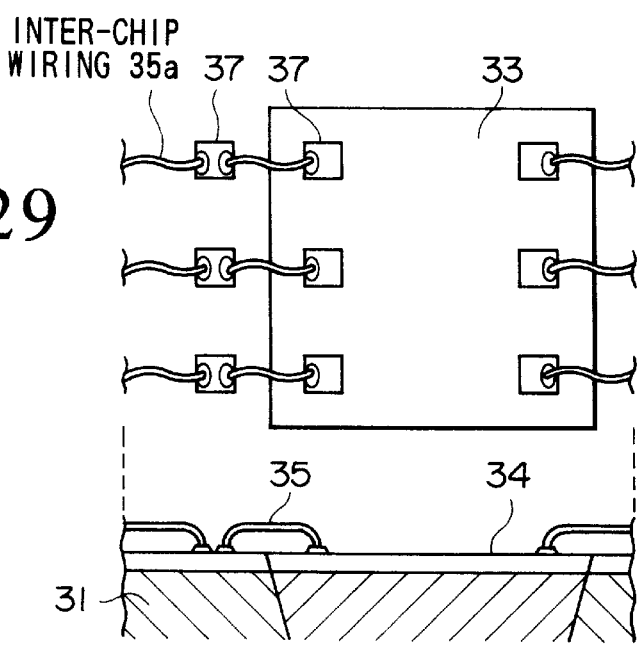
FIG. 29 is a view for explaining inter-element wiring electrode according to the fifteenth embodiment of the present invention.

As shown in FIG. 29, in this embodiment, the wirings between the element areas 34 in FIG. 28 are made using wires 35a.

Figure 30A:
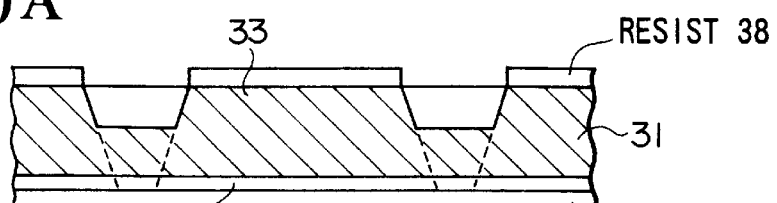
FIGS. 30A and 30B are sectional views for explaining a semiconductor device fabricated according to the sixteenth embodiment of the present invention.
Figure 30B:
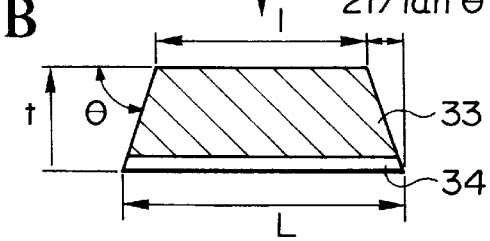

FIG. 30 shows the manner for fabricating an embedded element chip 33 with its sides in the {111} plane. First, resist is formed on both surfaces of a substrate 31 with a element area 34 formed on its one surface to prevent the substrate from being eroded by an etching solution. Next, the resist at the area including an etching margin is removed, and anisotropic etching is performed from the back side where no element area is present. The resultant etching margin is represented by $(2t/\tan\theta)=L-1$ where L is the horizontal length of the device area, t is a substrate thickness, and θ is the angle of the {111} plane formed by the anisotropic etching.

Figure 31A:
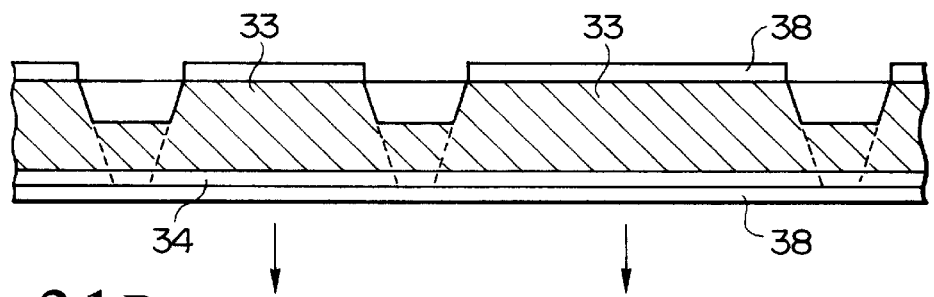
FIGS. 31A and 31B are sectional views for explaining a semiconductor device fabricated according to the seventeenth embodiment of the present invention.
Figure 31B:
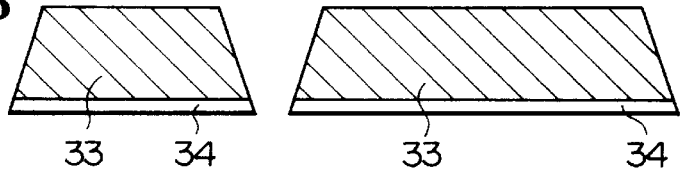

FIG. 31 shows the manner of fabricating plural embedded elements 33 each with its sides in the {111} plane and a different size.

Figure 32A:
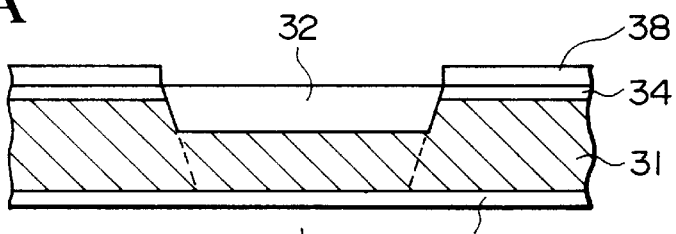
FIGS. 32A and 32B are sectional views for explaining a semiconductor device fabricated according to the eighteenth embodiment of the present invention.
Figure 32B:
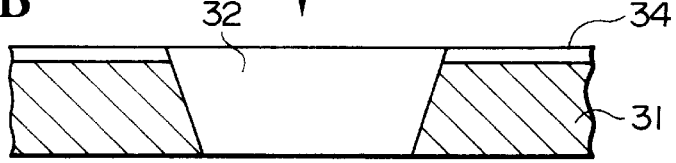

FIG. 32 shows the manner of fabricating a groove and through-hole 32 with its sides in the {111} plane. First, resist is formed on both surfaces of a substrate 31 with a element area 34 formed on its one surface to prevent the substrate from being eroded by an etching solution. Next, the resist at the area having a size of the embedded element chip is removed, and anisotropic etching is performed from the front side where the element area is present.

FIG. 33 shows the manner of fabricating plural grooves and through-holes 32 each with its sides in the {111} plane and a different size.

As shown in FIG. 34, in this embodiment, plural grooves and through-holes 32 each with its sides in the {111} plane and a different size are formed in a single semiconductor substrate, and thereafter, plural embed element chips 33 each with its side in the {111} plane and a different size are fit in the above corresponding grooves and through-holes 32. Therefore, semiconductor element chips having different sizes can be formed on a semiconductor substrate. Thus, it is possible to fabricate custom products according to the specification requested by a user by the number required by the user.

As shown in FIG. 35, in this embodiment, after plural embed element chips 33-1, 33-2 and 33-3 each with its sides in the {111} plane are fit in grooves and through-holes 32, respectively, a first wiring 35 is made between device areas 34, a second wiring 35b is made between the adjacent embed element chips 33-1 and 33-2 in a multi-layer insulting film 36a, and a third wiring 35c is made between the separate embed element chips 33-1 and 33-3 in a multi-layer insulating film 36b.

Figure 36:
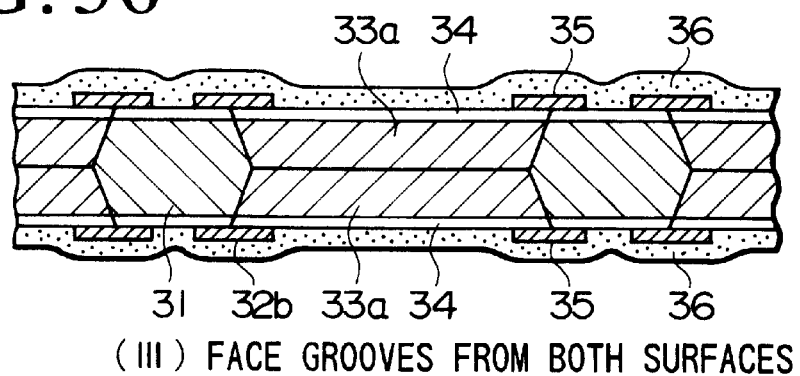
FIG. 36 is a sectional view for explaining a semiconductor device fabricated according to the twenty-second embodiment of the present invention.

As shown in FIG. 36, in this embodiment, grooves 32 each with its sides in the {111} plane are formed from both principal surfaces of a semiconductor substrate, and thin embed element chips 33a each with its sides in the {111} plane are fit in the grooves. Further, wirings 35 are made between the element chips and a protective insulating film 36 is also made. Such an arrangement permits semiconductor circuits to be fabricated in both surfaces of the semiconductor substrate.

Figure 37:
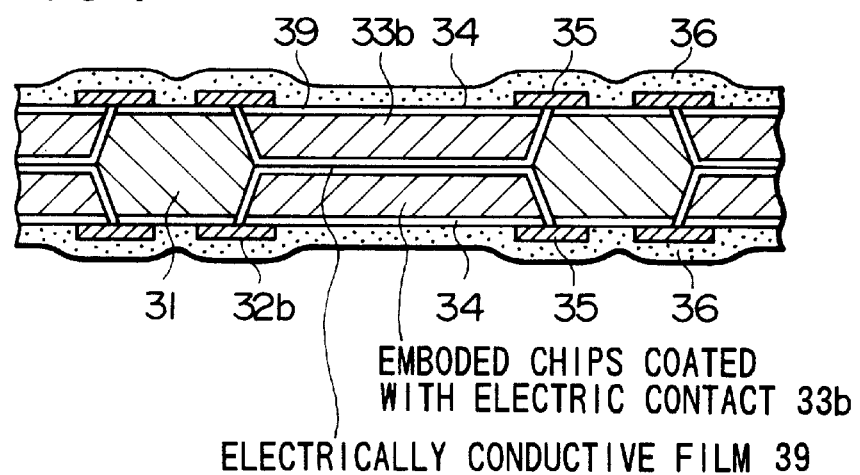
FIG. 37 is a sectional view for explaining a semiconductor device fabricated according to the twenty-third embodiment of the present invention.

As shown in FIG. 37, in this embodiment, grooves 32 with its sides in the {111} plane are formed from both principal surfaces of a semiconductor substrate, and thin embedded element chips 33a each with its sides in the {111} plane and covered in its side walls and bottom with an electrically conductive film 39 are fit in the grooves 32b; the conductive films 39 constitute electrical connections between the embedded element chips. Further, wirings for the embedded element chips and an insulating film for protecting them are formed. The resultant arrangement permits semiconductor circuits having electrical connections to be formed in both surfaces of the semiconductor substrate. This permits a three-dimensional semiconductor circuit to be fabricated.

Figure 38:
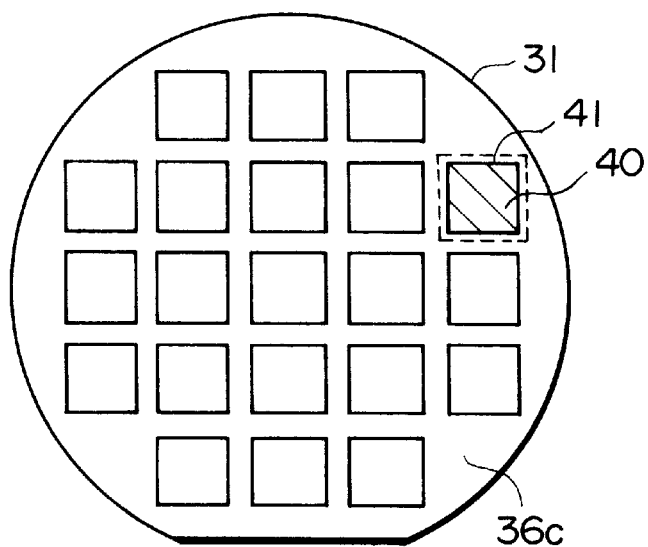
FIG. 38 is a plan view for explaining a semi-conductor device fabricated according to the twenty-fourth embodiment of the present invention.

In this embodiment, if a defective element chip(s) is found as a result of element chip testing, as shown in FIG. 38, a defective-element chip forming area 40 is formed in at least one groove of through-hole with its sides in the {111} plane. In forming a defective-element chip excluding area 41, an insulating film 36c for etching margin must be formed between the element areas 34 in a semiconductor substrate.

Figure 39:
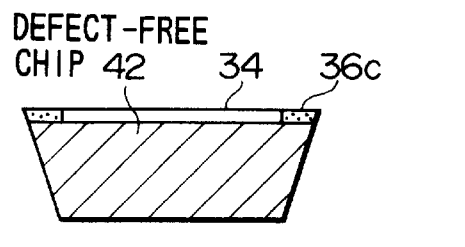
FIGS. 39A and 39B are sectional views for explaining a semiconductor device fabricated according to the twenty-fifth embodiment of the present invention.
Figure 39:
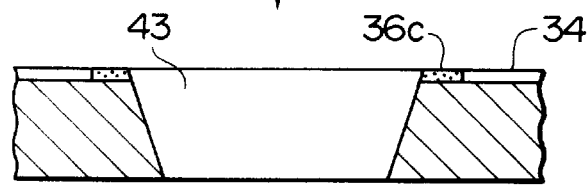

In this embodiment, as shown in FIG. 39, a defective-element chip forming area 40 is formed as at least one groove or through-hole with its sides in the {111} plane, and a defect-free embedded element chip 42 with its sides in the {111} plane is fit in the trace where the defective element chip has been removed.

Figure 40:
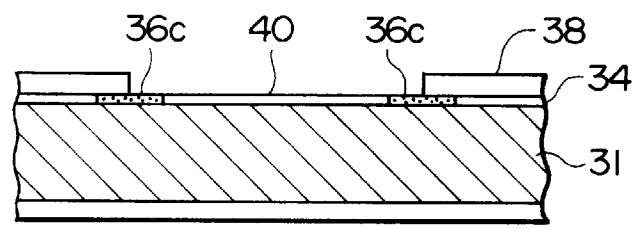
FIGS. 40A to 40C are sectional views for explaining a semiconductor device fabricated according to the twenty-sixth embodiment of the present invention.
Figure 40:
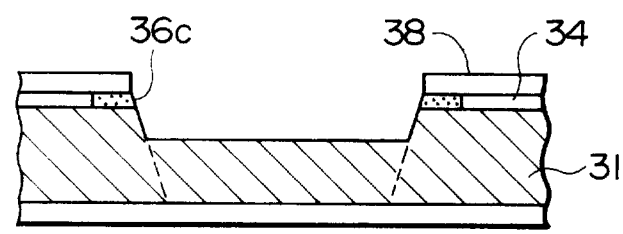
Figure 40:
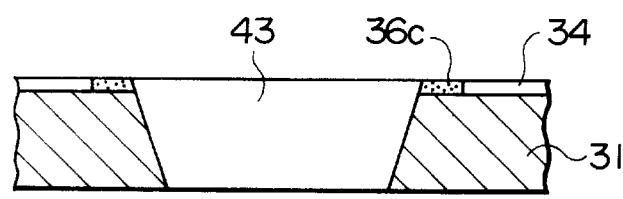

FIG. 40 shows the process for forming a defective-element chip forming area 40 as at least one groove or through-hole with its sides in the {111} plane. First, resist is formed on both surfaces of a semi-conductor substrate with device areas formed on its one surface so that the substrate is not eroded by an etching solution. Next, the resist for the defective element chip forming area 40 is removed and anisotropic etching is performed from the front side where the area 40 is present, thereby forming a defective-element chip removal trace 43 with its sides in the {111} plane.

Figure 41A:
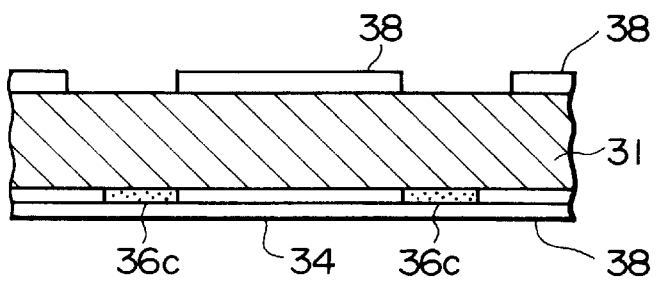
FIGS. 41A to 41C are views for explaining a semiconductor device fabricated according to the twenty-seventh embodiment of the present invention.
Figure 41B:
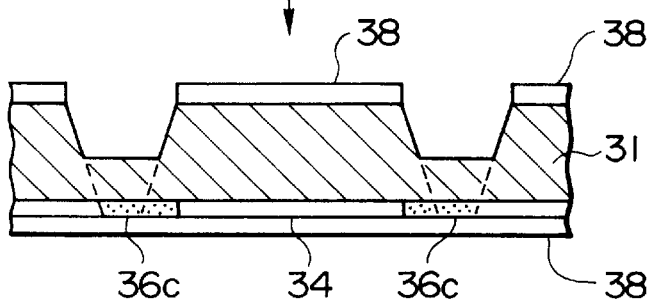
Figure 41C:
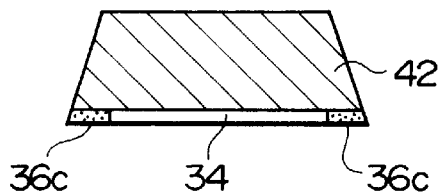

FIG. 41 shows the process for forming a defect-free element chip 42 to be fit in the defective-element chip removal trace. First, resist is formed on both surfaces of a semiconductor substrate with element areas formed on its one surface so that the substrate is not eroded by an etching solution. Next, the resist for the defective element chip forming area 40 is removed and anisotropic etching is performed from the back side where the area 40 is absent, thereby forming a defect-free element chip 42 with its sides in the {111} plane.

Figure 42:
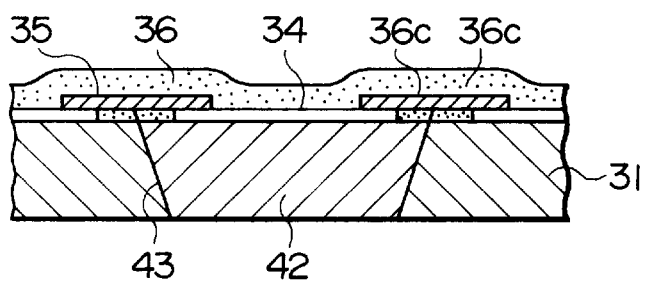
FIG. 42 is a sectional view for explaining a semiconductor device fabricated according to the twenty-eighth embodiment of the present invention.

As shown in FIG. 42, in the semiconductor device according to this embodiment, a defective-element chip removal trace 43 with its sides in the {111} plane is formed by anisotropic etching, and a defect-free element chip with its sides in the {111} plane formed by the same anisotropic etching is fit in the trace 43. Further, wirings 35 between the device areas 34 and an insulating film for protecting them are formed. Thus, the defective element chip is removed so that the resultant semiconductor circuit can be relieved.

Figure 43:
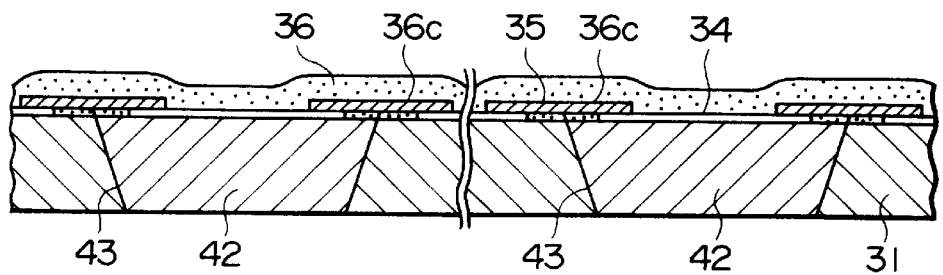
FIG. 43 is a sectional view for explaining a semiconductor device fabricated according to the twenty-ninth embodiment of the present invention.

As shown in FIG. 43, in the semiconductor device according to this embodiment, where there are plural defective-element chip forming areas, in the same manner as shown in FIG. 42, plural defective-element chip removal traces 43 each with its sides in the {111} plane are formed by anisotropic etching, and defect-free element chips each with its sides in the {111} plane formed by the same anisotropic etching are fit in the traces 43. Further, wirings 35 between the device areas 34 and an insulating film for protecting them are formed. Thus, the defective element chips are removed so that the resultant semiconductor circuit can be relieved.

Figure 44A:
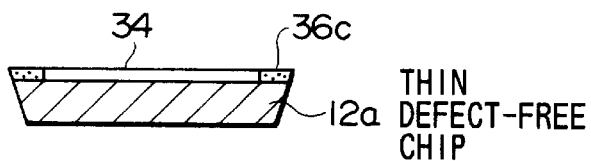
FIGS. 44A and 44B are sectional views for explaining a semiconductor device fabricated according to the thirtieth embodiment of the present invention.
Figure 44B:
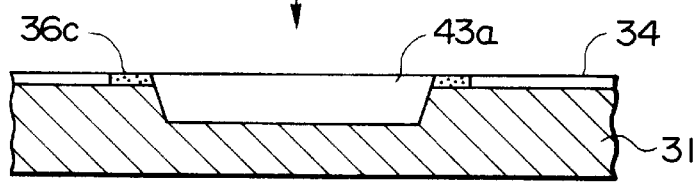

FIG. 44 shows the manner of fitting a thin defect-free element chip 42a into a shallow defective-element chip removal trace 43a with its sides in the {111} plane formed by anisotropic etching.

Figure 45A:
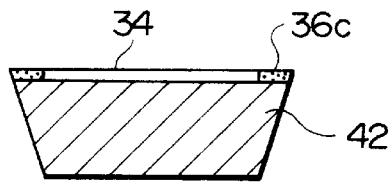
FIGS. 45A and 45B are views for explaining a semiconductor device fabricated according to the thirty-first embodiment of the present invention.
Figure 45B:
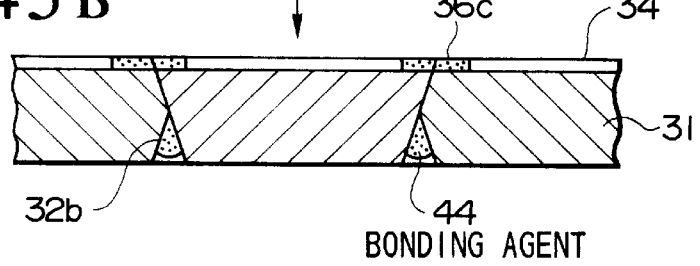

FIG. 45 shows the manner of forming grooves 32b each with its sides in the {111} plane from both surfaces of a semiconductor substrate by anisotropic etching, fitting in one of the grooves a defect-free embedded element chip with its sides in the {111} plane formed by the same anisotropic etching and fixing the element chip from the back surface of the substrate by a bonding agent 44.

Figure 46A:
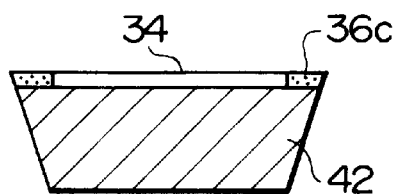
FIGS. 46A and 46B are views for explaining a semiconductor device fabricated according to the twenty-second embodiment of the present invention.
Figure 46B:
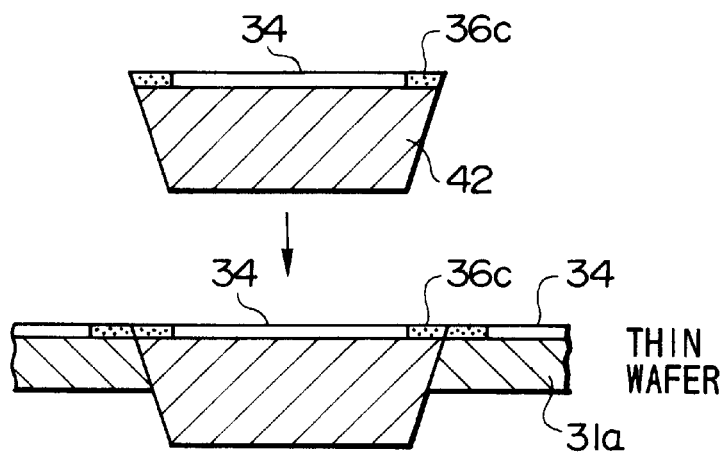

FIG. 46 shows the manner of forming a defective-element chip removal trace 43 with its sides in the {111} plane in a thin semiconductor substrate 31a, and fitting a defect-free element chip 42 in the trace.

Figure 47A:
FIGS. 47A and 47B are sectional views for explaining a semiconductor device fabricated according to the twenty-third embodiment of the present invention.
Figure 47B:
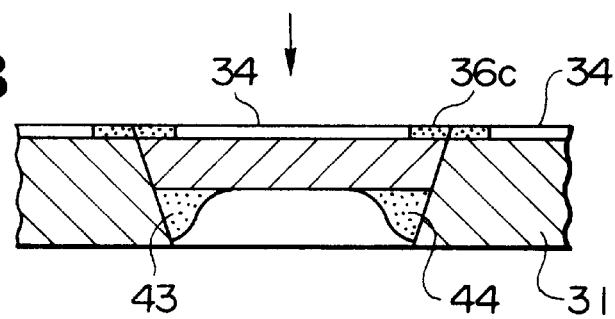

FIG. 47 shows the manner of forming a defective-element chip removal trace 43 with its sides in the {111} plane in a semiconductor substrate by anisotropic etching, fitting in the trace a thin defect-free embedded element chip 42a with its sides in the {111} plane formed by the same anisotropic etching and fixing the element chip from the back surface of the substrate by a bonding agent 44.

Figure 48A:
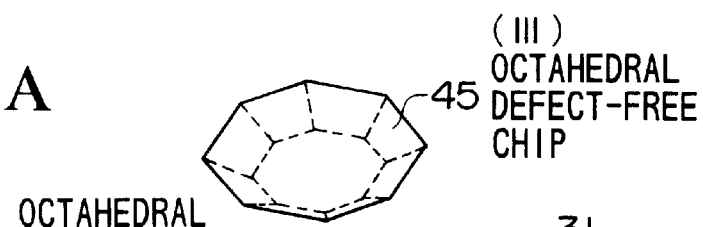
FIGS. 48A and 48B are views for explaining a semiconductor device fabricated according to the thirty-fourth embodiment of the present invention.
Figure 48B:
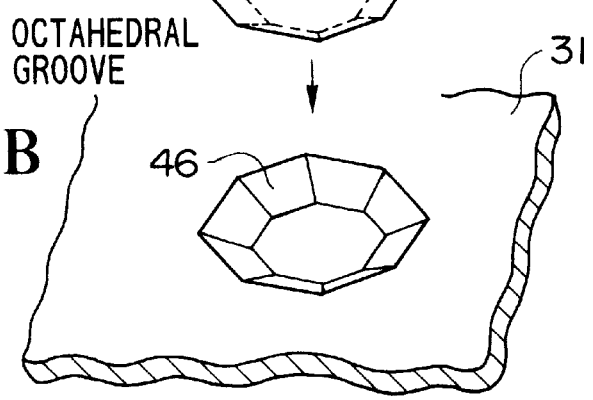

FIG. 48 shows the manner of forming an octahedral groove and through-hole 46 with its sides in the {111} plane in a semiconductor substrate 31 by anisotropic etching, and fitting in the groove and through-hole an octahedral defect-free element chip 45 with its sides in the {111} plane formed by the same anisotropic etching.

Figure 49A:
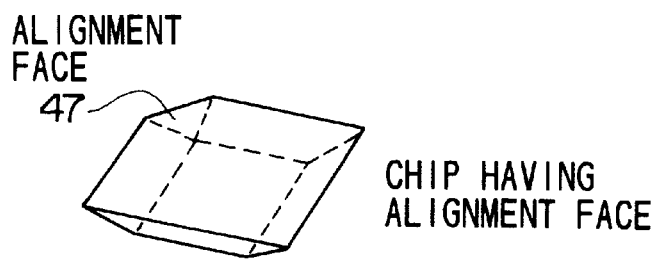
FIGS. 49A and 49B are perspective views for explaining a semiconductor device fabricated according to the thirty-fifth embodiment of the present invention.
Figure 49B:
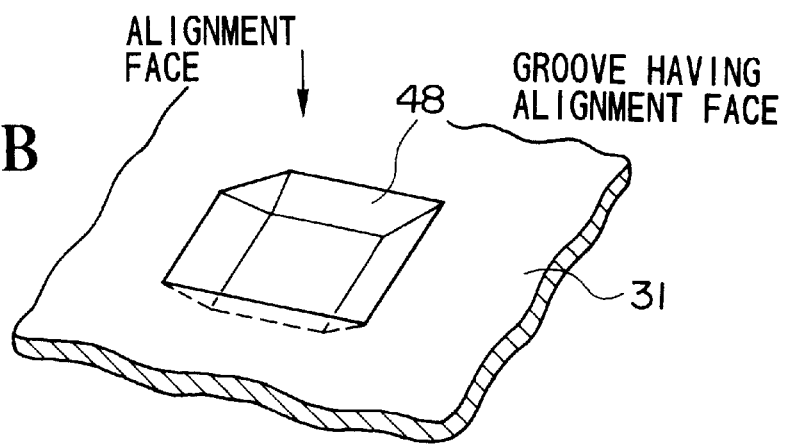

FIG. 49 shows the manner of forming a pentahedral groove and through-hole 46 with its sides in the {111} plane in a semiconductor substrate 31 by anisotropic etching, and fitting in the groove and thorough-hole a pentahedral defect-free element chip 45 with its sides in the {111} plane formed by the same anisotropic etching. It should be noted that one of the five faces of the groove is used an alignment face for determining the fitting direction.

In the embodiments shown in FIGS. 21 to 49 hitherto explained, the {111} plane was used as a crystal plane. The {111} plane is efficient because it is dense. The {111} plane can be easily obtained by anisotropic etching. For example, if crystal having four sides including Qne plane of (111), an opposite plane of (1-1-1), a right side plane of (1-11) and a left side plane of (11-1) when viewed from an orienting flat plane of (100) is etched with the orienting flat plate masked so that the (111) plane is in parallel to the orienting flat plane (line), the (111) plane inclined by about 54° can be obtained. If the crystal is etched with 45° tilted from the above orienting flat line, the (111) plane perpendicular to the orienting flat plane can be obtained. Further, with the orienting flat plane of (110), the (111) plane inclined by about 35° can be obtained. The etching temperature used is desired to be 40° C. or so.

Now referring to FIGS. 50 to 53, an explanation will be given of a wiring method according to this embodiment and the method of fabricating a semiconductor device using this wiring method.

Figure 50:
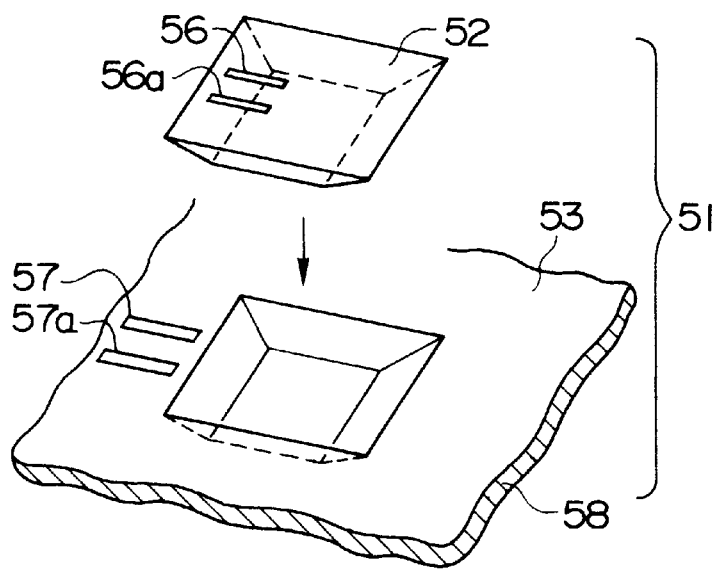
FIGS. 50 to 53 are schematic perspective views for explaining the process for fabricating a semiconductor device using the wiring manner according to the thirty-sixth embodiment of the present invention.
Figure 51:
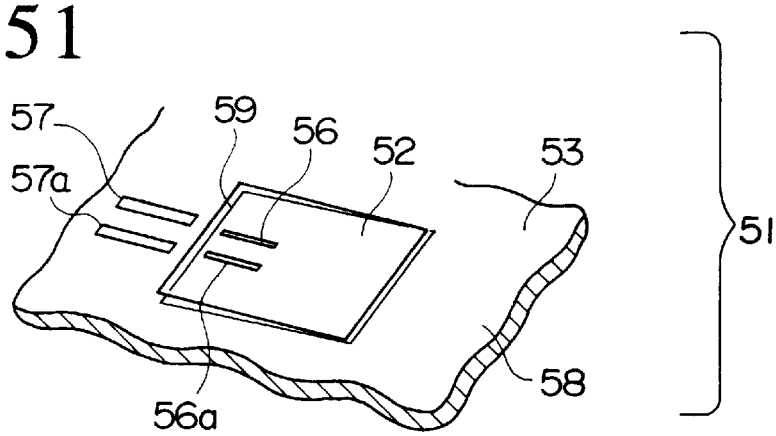
Figure 52:
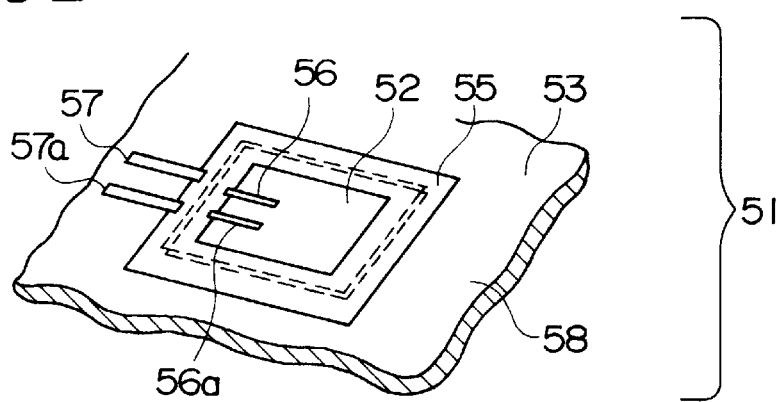

First, as shown in FIGS. 50 and 51, an embedded chip 52 having, at its end, bonding pads 56, 56a is fit in the hole made in a body chip 53 having bonding pads 57. 57a made in a semiconductor substrate 58. As shown in FIG. 52, an electrically conductive film 55 is formed around the embedded chip 52 to cover the ends of the bonding pads 56, 56a and 57, 57a.

Figure 53:
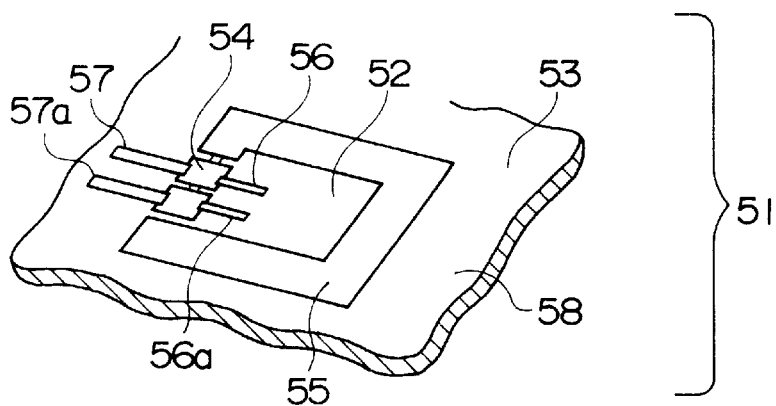

As shown in FIG. 53, the film 55 is partially burned off to provide optimum paths using laser so that the connected pads 5 56 and 57 are isolated from the connected pads 56a and 57a, thus forming connection wirings 54. In this case, it should be noted that the output of the laser is optimized so that heat by the laser does not leave damages such as crystal defects in the Si substrate.

The relative positions of the pads 56, 56a of the embedded chip 52 and pads 57, 57a of the body chip 53 which are to be recognized in selecting the laser radiating paths may be recognized by human eyes or an automatic image recognition technique.

For example, where the pads 56 and 57 are to connected as shown in FIG. 53, after their positions are recognized, the laser radiating paths are determined so that the connected pads 56 and 57 are isolated from the pads 56a and 57a.

In this embodiment, even when the embedded chip 52 has been fit in a bending manner in the body chip 53, the relative positions of the pads 56 of the embedded chip 52 and pad 57 of the body chip 53 are recognized and then the connection wirings 54 can be formed cutting the film 55 by the laser. Thus, the wirings can be made surely, thereby enhancing the production yield of semi-conductor devices.

In order to burn off the film 55 to form the connection wirings 54, focused ion beams, plasma or electron beams may be used in place of the laser.

Figure 54:
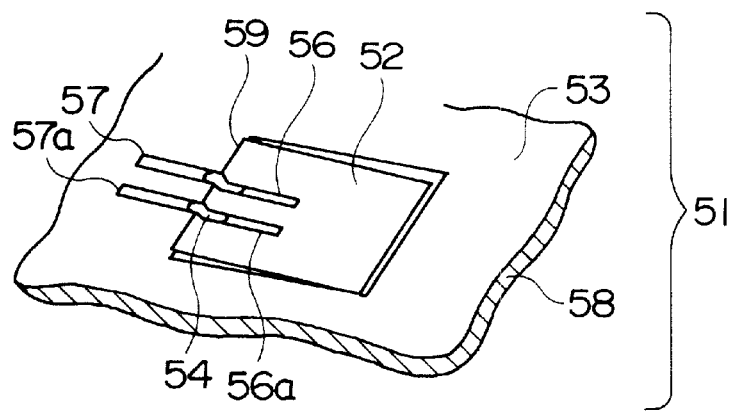
FIGS. 54 and 55 are schematic perspective views for explaining the structure of a semiconductor device using the wiring manner according to the thirty-seventh embodiment of the present invention.

FIG. 54 shows another wiring method. In this embodiment, the laser CVD method is used to form the connection wirings 54.

The laser radiation paths are selected after the relative positions of the pad 56 of the embedded chip 52 and the pad 57 of the body chip 53 are recognized. When laser beam is radiated along the selected paths in an atmosphere of a raw material gas for the laser CVD, the energy of the laser light can resolve the gaseous molecules of the raw material gas to deposit free atoms (molecules) along the laser-radiated regions or paths. As the excitation energy source, ion beams or electron beams may be used instead of the laser.

In this embodiment, even when the embed chip 52 has been fit in a bending manner in the body chip 53, the relative positions of the pads 56 of the embedded chip 52 and pad 57 of the body chip 53 are recognized and then the connection wirings 54 can be formed along the connection paths according to the above relative positions. Thus, the wirings can be made surely, thereby enhancing the production yield of semiconductor devices.

Figure 55:
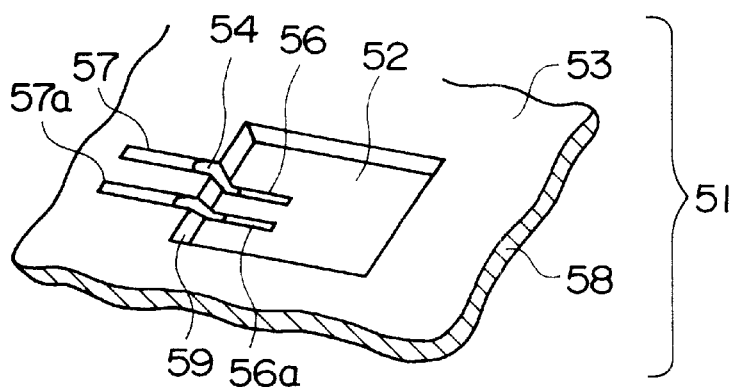

As shown in FIG. 55, where a level difference occurs between the embedded chip 52 and the body chip 53, scanning of the laser beam along the level difference permits the connection wirings 55 to be surely formed on the level difference. Namely, this permits wirings to be surely formed on the silicon substrate other than element areas.

Figure 56:
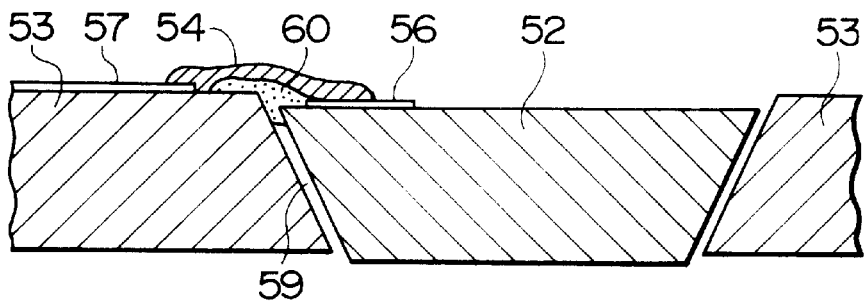
FIG. 56 is a schematic perspective views for explaining the structure of a semiconductor device using the wiring manner according to the thirty-eighth embodiment of the present invention.

FIG. 56 shows the structure of a semiconductor device using still another wiring method. This embodiment is particularly effective to the case where a gap or level difference is present between an embedded chip 52 and a body chip 53, i.e., at a fitting portion 59. In the semiconductor device according to this embodiment, a flattening layer 60 made of phosphorus silicate glass (PSG) or boron phosphorus silicate glass (BPSG) is provided at the fitting portion 59, and the wiring acquired as shown in FIGS. 54 to 56 is formed on the fattening layer 60. This semiconductor device is fabricated as follows.

As shown in FIG. 50, an embedded chip 52 having a bonding pad 56 at its end is fit in a hole made in a body chip 53 having a bonding pad 57. The flattening layer 60 is formed on the fitting portion 59 so that it does not cover the ends of both pads 56 and 57.

The resultant structure is heat-treated to flatten a gap or level difference at the fitting portion 59. An electrically conductive film 55 is formed to cover the ends of both pads 56 and 57.

Thereafter, the film 55 is partially burned off using laser to provide optimum paths so that the connected pads 56 and 57 are isolated from the other connected pads, thus forming connection wirings 54. Otherwise, the connection wirings 54 are formed on the fattening layer 60 by the laser CVD method.

The flattening layer 60 may be made of a spin-on-glass (SOG) film. The SOG film, when it is in an applied state where $Si(OH)_4$ is resolved in alcohol, has fluidity. So it can permeate into the gap or cover the level difference smoothly. Heat treatment is performed to harden the film. The connection wirings 54 are formed on the flattening layer 60.

In this embodiment, even when the embedded chip 52 has been fit in a bending manner in the body chip 53, the relative positions of the pads 56 of the embedded chip 52 and pad 57 of the body chip 53 are recognized and then the connection wirings 54 can be formed cutting the film 55 by the laser. Thus, the wirings can be made surely, thereby enhancing the production yield of semi-conductor devices.

Also when a level difference occurs between the embedded chip 52 and the body chip 53, the flattening layer 60 can smooth the level difference, thus permitting the wirings to be surely made.

What is claimed is:

1. A method of fabricating a semiconductor device comprising the steps of:

anisotropic etching entire sides of plural chips, on which semiconductor elements are formed, on the same {111} crystal plane of their semiconductor substrate surface; and joining the anisotropic etched sides of the chips to connect the chips.

2. A method of fabricating a semiconductor device comprising the steps of:

contacting sides of a plurality of chips, each having a semiconductor element formed in a semiconductor substrate surface thereof, directly to each other on the same {111} crystal plane; and bonding faces of the contacted sides of the chips at a temperature of at least 400° C.

3. A method of fabricating a semiconductor device according to claim 1, further comprising the steps of:

forming an electrically conductive film such that the film extends over the edge of a chip and that of another chip; and in accordance with the connection format of wirings, dividing the film by cutting using any one of a laser, ion-beam, plasma and electron beam.

4. A method of fabricating a semiconductor device according to claim 2, further comprising the steps of:

forming an electrically conductive film such that the film extender over the edge of a chip and that of another chip; and in accordance with the connection format of wirings, dividing the film by cutting using any one of a laser, ion-beam, plasma and electron beam.

5. A method of fabricating a semiconductor device according to claim 1, wherein positions of wirings connecting the chips to each other are set to predetermined locations.

6. A method of fabricating a semiconductor device according to claim 2, wherein positions of wirings connecting the chips to each other are not to predetermined locations.

* * * * *